US007733435B2

United States Patent
Hirakata et al.

(10) Patent No.: US 7,733,435 B2
(45) Date of Patent: Jun. 8, 2010

(54) ACTIVE MATRIX SUBSTRATE, DISPLAY APPARATUS, AND PIXEL DEFECT CORRECTION METHOD

(75) Inventors: Yoshio Hirakata, Kameyama (JP); Masanori Takeuchi, Tsu (JP); Toshihide Tsubata, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 515 days.

(21) Appl. No.: 11/658,022

(22) PCT Filed: May 19, 2006

(86) PCT No.: PCT/JP2006/010054

§ 371 (c)(1),
(2), (4) Date: Jan. 22, 2007

(87) PCT Pub. No.: WO2006/126460

PCT Pub. Date: Nov. 30, 2006

(65) Prior Publication Data

US 2008/0024690 A1    Jan. 31, 2008

(30) Foreign Application Priority Data

May 23, 2005    (JP)    ............................. 2005-150145

(51) Int. Cl.
*G02F 1/1333* (2006.01)
*G02F 1/1343* (2006.01)
(52) U.S. Cl. ............................. 349/55; 349/54; 349/192
(58) Field of Classification Search .................... 349/48, 349/54, 55, 192; 345/93
See application file for complete search history.

(56) References Cited

U.S. PATENT DOCUMENTS

| 4,894,690 A | | 1/1990 | Okabe et al. | |
|---|---|---|---|---|
| 5,483,082 A | * | 1/1996 | Takizawa et al. | ............... 257/59 |

(Continued)

FOREIGN PATENT DOCUMENTS

EP    1 193 676 A2    4/2001

(Continued)

OTHER PUBLICATIONS

International Search Report for PCT/JP2006/310054 mailed Jun. 13, 2006.

(Continued)

*Primary Examiner*—Michael H Caley
(74) *Attorney, Agent, or Firm*—Nixon & Vanderhye, P.C.

(57) ABSTRACT

An active matrix substrate comprises a TFT (4) in which a plurality of drain electrodes (16a and 16b) are provided for a single source electrode (6), and at least one of the drain electrodes is electrically connected to the pixel electrode (1) via the drain outgoing wire. The drain outgoing wire includes a first conductive pattern section comprising (i) a drain outgoing wire common section (7d) and drain outgoing branch sections (7a and 7b) each of which extends from said drain outgoing common section into each of said drain electrodes, and (ii) a correction connection electrode 9 which is partially overlapped with said branch sections of said first conductive pattern section via an insulating layer. The correction connection electrode 9 is electrically connectable to a plurality of said branch sections by being conducted to said branch sections through said insulating layer. This structure allows pixel defect correction within the pixel.

30 Claims, 28 Drawing Sheets

U.S. PATENT DOCUMENTS

| | | | |
|---|---|---|---|
| 5,621,555 A * | 4/1997 | Park | 349/54 |
| 5,953,084 A | 9/1999 | Shimada et al. | |
| 6,052,162 A | 4/2000 | Shimada et al. | |
| 6,097,452 A | 8/2000 | Shimada et al. | |
| 6,195,138 B1 | 2/2001 | Shimada et al. | |
| 6,661,488 B1 | 12/2003 | Takeda et al. | |
| 6,724,452 B1 | 4/2004 | Takeda et al. | |
| 7,430,024 B2 * | 9/2008 | Yagi et al. | 349/54 |
| 2001/0002857 A1 | 6/2001 | Shimada et al. | |
| 2002/0074580 A1 | 6/2002 | Anzai et al. | |
| 2002/0075254 A1 | 6/2002 | Anzai | |
| 2002/0084746 A1 | 7/2002 | Anzai | |
| 2002/0101394 A1 | 8/2002 | Anzai | |
| 2004/0119924 A1 | 6/2004 | Takeda et al. | |
| 2004/0164303 A1 | 8/2004 | Anzai | |
| 2005/0162599 A1 * | 7/2005 | Kurihara et al. | 349/139 |

FOREIGN PATENT DOCUMENTS

| | | |
|---|---|---|
| JP | 02-135320 | 5/1990 |
| JP | 02-135320 A | 5/1990 |
| JP | 4-350825 A | 12/1992 |
| JP | 5-341316 | 12/1993 |
| JP | 7-199221 | 8/1995 |
| JP | 7-199221 A | 8/1995 |
| JP | 2001-117083 | 4/2001 |
| JP | 2001-117083 A | 4/2001 |
| JP | 2002-175029 | 6/2002 |

OTHER PUBLICATIONS

EP Supplementary European Search Report mailed Nov. 6, 2009 in corresponding EP application 06746661.5.

* cited by examiner

F I G. 2 7
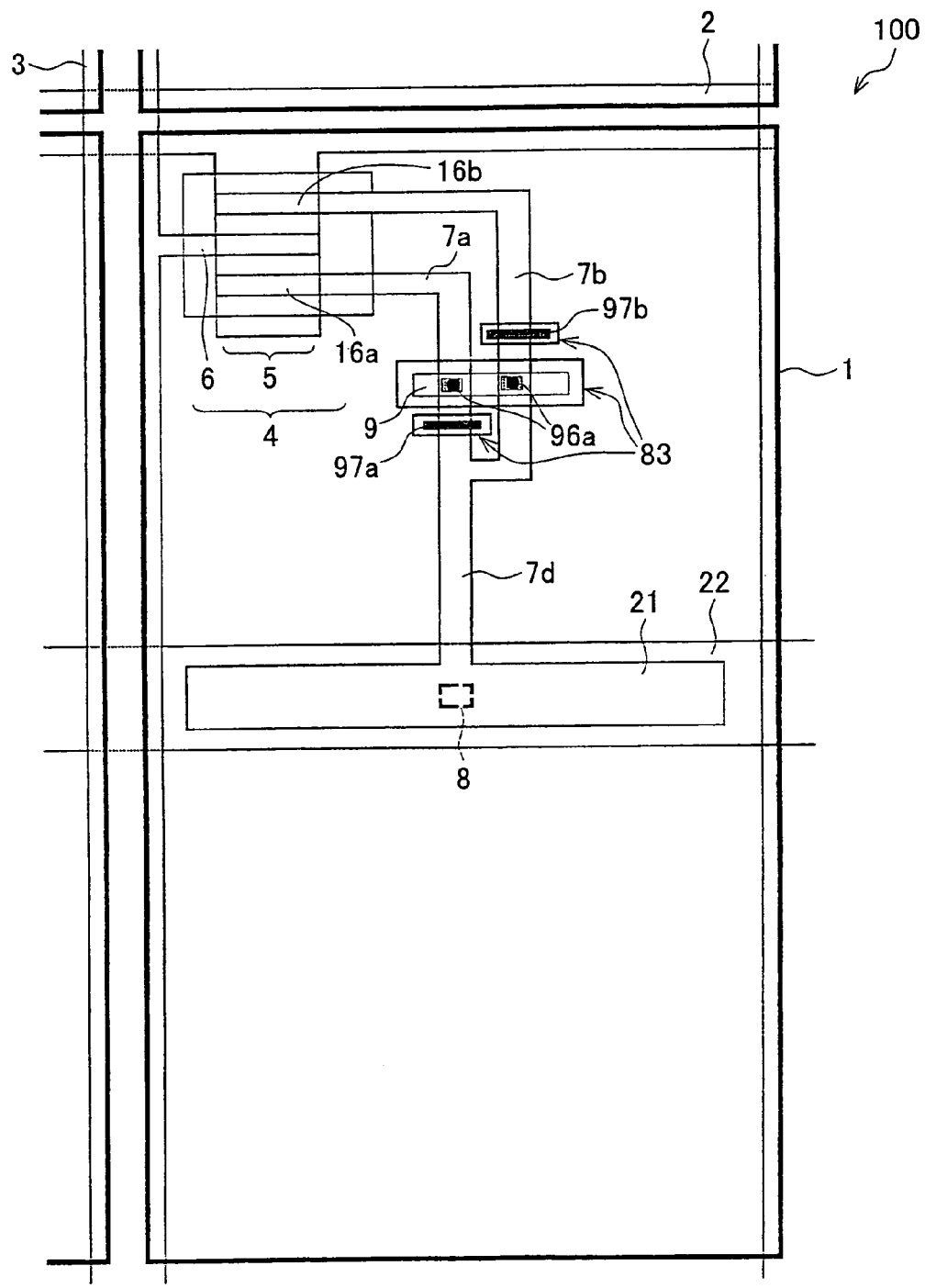

ACTIVE MATRIX SUBSTRATE, DISPLAY APPARATUS, AND PIXEL DEFECT CORRECTION METHOD

This application is the U.S. national phase of international application PCT/JP2006/310054 filed 19 May 2006, which designated the U.S. and claimed priority of JP 2005-150145 filed 23 May 2005, the entire contents of each of which are hereby incorporated by reference.

TECHNICAL FIELD

The present invention relates to an active matrix substrate for various display apparatuses, such as a liquid crystal display apparatus, EL (Electro Luminescence) display apparatus etc. More specifically, the present invention relates to an active matrix substrate suitable for a liquid crystal display apparatus with a large liquid crystal display screen, such as a large-size liquid crystal television.

BACKGROUND ART

An active matrix substrate is widely used for various active matrix display apparatuses such as a liquid crystal display apparatus, an EL (Electro Luminescence) display apparatus etc. In an active matrix substrate used for a conventional active matrix liquid crystal display apparatus, a switching element such as a TFT (Thin Film Transistor) is provided in each intersection of a plurality of scanning signal lines and a plurality of data signal lines which are intersect with each other on a base substrate. With the switching function of this switching element such as a TFT, each pixel (electrode) of pixel section connected to the switching element (eg. TFT) is supplied with a pixel signal according to circumstances. Further, there is a kind of active matrix substrate in which each pixel section has a retention capacitor element. This gives an effect of preventing self-discharge of liquid crystal layer or degradation of pixel signal caused by off-current of TFT or the like during off-state of the TFT or the like. The retention capacitor element is also used as a supply path of various modulation signals for driving liquid crystal.

The following describes concrete examples (eg. Document 1) of known structure of active matrix substrate used for a conventional active matrix liquid crystal display apparatus. FIG. 18 is a schematic plan view showing a single pixel of an active matrix substrate of a conventional active matrix liquid crystal display apparatus.

As shown in FIG. 18, in a conventional active matrix substrate 200, a plurality of pixel electrodes 51 are arranged in matrix, surrounded by scanning signal lines 52 for supplying scanning signals, and data signal lines 53 for supplying data signals, which intersect with each other. Further, a TFT 54 is provided in each intersection of the scanning signal lines 52 and the data signal lines 53. The TFT 54 serves as a switching element connected to the pixel electrode 51. The gate electrode 55 of the TFT 54 is connected to the scanning signal lines 52 through which scanning signals are supplied. In this manner the driving of TFT 54 is controlled. Further, the source electrode 66a of the TFT 54 is connected to the data signal lines 53 through which data signals are supplied. Further, the drain wire 56 is connected to the drain electrode 66b of the TFT 54, the drain wire 56 is also connected to one of the electrodes (retention capacitor upper electrode) 57 of the retention capacitor element, and the retention capacitor electrode 57 is connected to a pixel electrode 51 via a contact hole 58. A retention capacitor (common) wire 59 serves as the other one (retention capacitor lower electrode) of the two electrodes of the retention capacitor element.

The liquid crystal display apparatus used for a large-sized liquid crystal TV often adopts a Vertical Alignment (VA) mode having a multi-domain, or so-called a Multi-domain Vertical Alignment (MVA) mode, so as to ensure a wide viewing angle (see Document 2, for example).

In the MVA mode, the pixel electrodes of the active matrix substrate and the counter electrodes of the counter substrate are provided with an exsection pattern or an alignment control projection for adjusting alignment of liquid crystal molecules from which a fringe field is formed. Provision of fringe field has an effect of scattering the liquid crystal molecules so that they are aligned into plural directions. This is how the wide viewing angle is ensured. In this way, the conventional active matrix substrate shown in FIG. 18 ensures a wide viewing angle by having an exsection pattern or an alignment control projection for adjusting alignment of liquid crystal molecules in each of the pixel electrodes of the active matrix substrate and the counter electrodes of the counter substrate. Further, in order to prevent light leak or improve initial response speed after voltage application, there is a technique of embedding electrodes in the portions having the exsection patterns (may be referred also to as electrode slits) of the pixel electrodes and the counter electrodes (see Document 3, for example).

In the manufacturing process of active matrix substrate, foreign bodies or remaining films may cause short-circuit (leak) between the source electrode and the drain electrode of a TFT. In the resulting defective pixel, the pixel electrodes cannot be given proper voltages (drain voltages). As a result, some defective spot such as a luminescent spot or a black spot occur in the display screen of the liquid crystal display apparatus. This results in a decrease in yield of manufacturing.

In view of this problem, there is a technique for forming a correction connection wiring in advance between each of an adjacent pair of pixels (see Document 4, for example). In the case of pixel defect, this technique carries out laser irradiation with respect to the correction connection wiring so as to allow the pixel electrode of the defective pixel to be electrically conducted to the pixel electrode of the adjacent pixel. In this way, the voltage equal in potential to that of the adjacent pixel is supplied to the defective pixel, and the defective pixel is driven by a pseudo operation.

However, this method needs to be improved to solve the following problem. Normally (in normal operation), the pixels are insulated with each other, and therefore the correction connection wirings are required to be formed across the pixels. Therefore, as the area of the correction connection wiring increases, the aperture ratio decreases. Further, in the sporadic short-circuit (leak) between the source electrode and the drain electrode of the TFT, it is preferable to compensate the error within the pixel in which the defect occurs. This is because, if the defective pixel is driven by the TFT of the adjacent pixel via the correction connection wiring after the leakage portion is cut off, an extra driving load is exerted on the TFT of the adjacent pixel. However, in the foregoing pixel defect correction method, the defect of the pixel can be corrected only by connecting adjacent pixels. Therefore, the correction within the pixel concerned was not possible. Suggested to solve this problem of TFT defect is a redundant structure of liquid crystal display apparatus. In the redundant structure, a plurality of TFTs is connected in parallel with respect to a single pixel (see Document 5, for example).

[Document 1]
Japanese Unexamined Patent Publication Tokukaihei 09-152625/1997 (published on Jun. 10, 1997)
[Document 2]
Japanese Unexamined Patent Publication Tokukai 2001-83523/2001 (published on Mar. 30, 2001)
[Document 3]
Japanese Unexamined Patent Publication Tokukai 2001-117083/2001 (published on Apr. 27, 2001)
[Document 4]
Japanese Unexamined Patent Publication Tokukaihei 02-135320/1990 (published on May 24, 1990)
[Document 5]
Japanese Unexamined Patent Publication Tokukaihei 07-199221/1995 (published on Aug. 4, 1995)

DISCLOSURE OF INVENTION

However, in the structure of liquid crystal display apparatus described in Document 5 in which the TFTs (active elements) are aligned in parallel and the electrodes connected to the signal line is required to be cut off, there are problems of low aperture ratio because of the complexity of the electrodes, and high probability of disconnection of the electrodes. The signal supplied from the signal line is an essential component for allowing the display apparatus to display an image, and therefore, the disconnection of the electrodes from the signal line is a fatal defect for a display apparatus.

The present invention is made in view of the foregoing problems, and an object is to provide an active matrix substrate which does not cause a decrease in aperture ratio even in the case of correcting defects within the pixel. With this feature, the present invention provides an active matrix substrate which significantly reduces disconnection of electrodes from the signal line.

An active matrix substrate according to the present invention includes an active element having at least one source electrode, two or more drain electrodes, and two or more channels, at least one of said drain electrodes is electrically connected to a pixel electrode via a wire section, said wire section (drain outgoing wire) includes a first conductive pattern section having a common section (drain outgoing wire common section) continuous to a pixel electrode and branch sections (drain outgoing wire branch section) each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer.

With this arrangement, the active elements are not required to be aligned in parallel, as in FIG. 1 of Document 5. As a result, the layout of electrode ("source electrode" in this specification) becomes simpler, and the aperture ratio does not decrease because of the source electrode. Also, pixel defect correction within a pixel becomes possible with a low probability of disconnection of the electrodes. Such a wire layout of active element is suitable for a structure in which two or more of the branch sections (drain outgoing wire branch section) are connected to the active element.

With this arrangement, aperture ratio does not significantly decrease even with plural stages of active element, and also sufficient effect of the present invention is ensured. More specifically, an active element with two or more of drain electrodes is identical to an active element with the same number of channels. With this arrangement, pixel defect caused by some kind of defect (such as a leak) in a channel can be modified by using another proper channel within the same active element.

For example, in the case where a channel has a problem of leak (short-circuit) between the source electrode and the drain electrode, the branch section (drain outgoing wire branch section) connected to the channel is cut, and then the separated branch section (drain outgoing wire branch section) is connected (drain/drain connection) into a branch section (drain outgoing wire branch section) connected to a proper channel via the correction connection electrode. In this way, all of the branch sections (drain outgoing wire branch section) may be supplied with substantially the same drain potentials. Moreover, as described, this arrangement allows provision of a plurality of branch sections (drain outgoing wire branch section), thereby providing redundant paths for supplying potentials to pixel electrodes.

The active matrix substrate according to the present invention is preferably arranged so that each one of said source electrodes corresponds to two or more of said drain electrodes. Specifically, in the active element, a single source electrode corresponds to a plurality of drain electrodes, and at least one of the drain electrodes is connected to the pixel electrode via a wire section, said wire section (drain outgoing wire) including (i) a first conductive pattern section having a common section (drain outgoing wire common section) continuous to a pixel electrode and branch sections each of which extends from said common section and is broken into each of said drain electrodes, and (ii) a second conductive pattern section (second conductive layer, correction connection electrode) which is partially overlapped with said branch sections of said first conductive pattern section via an insulating layer, said second conductive pattern section being electrically connectable to a plurality of said branch sections by being conducted to said branch sections through said insulating layer.

As described in Document 5, in a liquid crystal display apparatus in which a plurality of TFTs (active element) are aligned in parallel to ensure redundancy, a parasitic capacitor increases between the source electrode of TFT and scanning signal line. Therefore, with the increase in signal writing frequency in recent years, the capacitor load of the data signal line connected to the source electrode increases, which causes a decrease in display quality (especially for moving pictures). Another problem is an increase in power consumption.

On the other hand, in the foregoing structure in which a plurality of drain electrodes are provided for a single source electrode, the layout of electrode connecting into signal line becomes simpler, and the aperture ratio does not decrease because of the source electrode. Also, pixel defect correction within a pixel becomes possible with a low probability of disconnection of the electrodes. Further, it ensures an effect of high-speed display response and reduction in power consumption.

The active matrix substrate according to the present invention may be arranged so that each one of said drain electrode corresponds to two or more of said source electrode.

With this arrangement in which a plurality of source electrodes are provided for a single drain electrode, the same number of channels as those in the foregoing structure in which a plurality of drain electrodes for a single source electrode are ensured with a less number of drain electrodes. With this arrangement, the active matrix substrate of the present embodiment prevents decrease of pixel potential by the parasitic capacitor (Cgd) between the source electrode and the drain electrode of the active element. On this account, it is possible to decrease the source voltage which increases the pixel electrode to a desired effective voltage. As a result, the entire power consumption is reduced.

Note that, in order to prevent decrease in aperture ratio, it is preferable that a single drive region include a single active element. The drive region corresponds to a pixel or a sub-pixel. "Sub-pixel" will be explained later.

The active matrix substrate according to the present invention is preferably arranged so that said second conductive pattern section (correction connection electrode) is formed by electrically separating a gate electrode conductive layer of said active element from at least one conductive layer.

With this arrangement, the second conductive pattern section (correction connection electrode) and the gate electrode of the thin film transistor are formed from the same conductive material. Therefore, the manufacturing process can be simplified and shortened, and the production cost can be reduced.

The active matrix substrate according to the present invention is preferably arranged so that said second conductive pattern section (correction connection electrode) is so formed that a retention capacitor wire conductive layer is electrically separable from at least one conductive layer.

With this arrangement, the second conductive pattern section (correction connection electrode) and the retention capacitor wire conductive layer are formed from the same conductive material. Therefore, the manufacturing process can be simplified and shortened, and the production cost can be reduced.

The active matrix substrate according to the present invention may further comprise a plurality of said second conductive patterns for each of said active element.

In the structure having a single second conductive pattern section (correction connection), a defective pixel cannot be corrected if the branch section (drain outgoing wire branch section) or the second conductive pattern section is cut off. On the other hand, in the foregoing structure in which a plurality of second conductive pattern sections are provided for a single active element, it is possible to carry out pixel defect correction even if the branch section or the second conductive pattern section is cut off.

In view of this, the active matrix substrate according to the present invention may be arranged so that three or more of said drain electrodes are provided for each of said active element, and three or more of said branch sections are provided for each of the drain electrodes, said plural second conductive patterns including a second conductive pattern A section which is electrically connectable to all of the branch sections; and a second conductive pattern B section which is electrically connectable to two or more of the branch sections.

In this manner, in the case of using three or more branch sections, the second conductive pattern B section which is connectable to two or more of the branch sections is provided. This maintains a certain redundant effect, and ensures high aperture ratio, compared with the case of constituting all of the second conductive pattern sections as the second conductive pattern A sections which are connectable to all of the branch sections.

In this case of using the second conductive pattern B section, it is preferable that said second conductive pattern B be formed with a portion overlapped with a branch section longest in length among the plural branch sections in the first conductive section, so as to enable said branch section longest in length to be electrically connectable to another branch section.

A longer wire is more likely to break. Among the two or more branch sections in the first conductive pattern section, the longest branch section is most likely to break. In this manner, the second conductive pattern B is provided so as to enable said branch section longest in length to be electrically connectable to another branch section. Consequently, the probability of pixel defect correction increases.

The active matrix substrate is preferably arranged so that the active matrix substrate is made up of pixels each of which is constituted of plural sub-pixels, each of said sub-pixels including an active element having said correction connection electrode.

"A pixel constituted of plural sub-pixels" indicates so-called a multi pixel structure in which a pixel is broken into a plurality of pixels, and each sub-pixel is driven individually.

Such a structure in which a single pixel is broken into plural sub-pixels is suitable for a structure for performing pixel defect correction. In a display apparatus with a large screen and a low resolution, a pixel defect caused by a leak of a channel in an active element is preferably corrected by modifying driving of the pixel by using another proper channel; however, since a large pixel has a large pixel capacitor, the active element needs to be increased if the pixel defect correction is completed within the pixel. This causes a decrease in aperture ratio or an increase in parasitic capacitor of active element. This may affect the display quality.

For example, in the case of a display apparatus of 37 inch/960×540 dot, the size of a single pixel is 284 μm×854 μm, but a pixel constituted of 2 sub-pixels according to the foregoing structure has a half size thereof. Therefore, the pixel capacitor can be reduced, and the pixel defect correction can be performed within the same pixel without significantly decreasing display quality.

In the multi pixel structure, it is preferable that at least two of said sub-pixels differ from each other in luminance. In this structure, a single pixel has a bright sub-pixel and a dark sub-pixel, and therefore a middle tone is expressed by area gradation. This is effective to reduce excess brightness in the oblique viewing angle in a liquid crystal display.

Further, in the case of adopting the multi pixel structure, the active matrix substrate according to the present invention includes two or more retention capacitor lower electrodes supplied with signal voltages inverted in phase. The two or more retention capacitor lower electrodes are overlapped via the insulating layer with retention capacitor upper electrodes corresponding to different sub-pixels. This structure is useful for forming a bright sub-pixel and a dark sub-pixel.

Note that, "the signal voltage inverted in phase supplied to the two or more retention capacitor lower electrodes" designates a Cs waveform voltage used for control of area gradation in a pixel of pixel divisional manner. The Cs waveform is broken into two kinds: a Cs waveform voltage (positive Cs) which contributes a rise of the drain signal voltage supplied from the source at the time of capacitance coupling after the gate signal is stopped; and a Cs waveform voltage (negative Cs) which contributes a fall of Vs.

In such a pixel divisional manner (area gradation technology), the effective voltage is varied for each pixel by the capacitance coupling of Cs waveform voltage, Cs capacitor, and liquid crystal capacitor, so as to form a bright sub-pixel and a dark sub-pixel. The multi driving of the sub-pixels is thus carried out. Such a pixel divisional manner (area gradation technology) is disclosed in detail in Japanese Laid-Open Patent Publication Tokukai 2000-62146.

Examples of the pixel divisional manner includes a 1:1 pixel divisional structure in which the bright sub-pixel and the dark sub-pixel are identical in area; and a 1:3 pixel divisional structure in which the bright sub-pixel has a ⅓ area of that of the dark sub-pixel. Among these, the 1:3 pixel divisional structure is particularly effective to reduce excess brightness in the oblique viewing angle in a liquid crystal display.

In the structure with a bright sub-pixel and a dark sub-pixel, a pixel defect due to channel leak in the active element is less likely to be recognized as a defect in the dark-sub-pixel, compared to the bright sub-pixel. On this account, only the bright sub-pixel has the correction connection electrode to carry out pixel defect correction. With this arrangement, pixel defect correction process can be simplified and the decrease in aperture ratio due to the correction connection electrode can be reduced.

The overlapping portion of said second conductive pattern section (correction connection electrode) overlapped with said branch sections (drain outgoing wire branch section) of said first conductive pattern section via an insulating layer is preferably 25 $\mu m^2$ or greater in square measure dimension.

With this arrangement, it is possible to ensure sufficient laser irradiation area in the insulating film melting process with Yttrium Aluminum Garnet (YAG) laser. Consequently, reliability of conduction between the second conductive pattern section (correction connection electrode) and the branch section (drain outgoing wire branch section) increases. Further, considering the variation of the overlapping area due to alignment variation in the photolithography process, increase in irradiation beam diameter upon the laser irradiation with YAG laser, and the taper film shape of the melted portion of the second conductive pattern section (film) or the branch section, it is preferable to enlarge the superimposition area to some extent. Specifically, the superimposition area is preferably 400 $\mu m^2$ or greater.

Said second conductive pattern section (correction connection electrode) is preferably constituted of at least one substance selected from a group consisting of Al, Cr, Ta, Ti, W, Mo and Cu. With this arrangement in which said second conductive pattern section is formed from a material including the high-melting-point metal(s), conduction between the second conductive pattern section and various electrodes and wires by way of melting with YAG laser or the like can be performed securely and easily, compared with a transparent conductive film of ITO or the like.

Said second conductive pattern section has a portion overlapped with a liquid crystal molecule alignment control projection or a liquid crystal molecule alignment control electrode slit. The region where the alignment control projection or the electrode slit for adjusting alignment of liquid crystal molecules formed on the counter substrate or the active matrix substrate of the liquid crystal display apparatus generally does not serve as a transmission region (opening section). Therefore, by disposing the second conductive pattern section to be overlapped with the region, it is possible to prevent the decrease in aperture ratio due to provision of the second conductive pattern section.

In view of this, "Overlapped with a liquid crystal molecule alignment control projection or a liquid crystal molecule alignment control electrode slit" indicates a state where the second conductive pattern is overlapped with the liquid crystal molecule alignment control projection or the liquid crystal molecule alignment control electrode slit when viewed from the vertical direction of the substrate (liquid crystal panel). The liquid crystal molecule alignment control projection or a liquid crystal molecule alignment control electrode slit may be provided on the active matrix substrate of the present invention, or on the counter substrate opposed to the active matrix substrate. An active matrix substrate with such a structure is useful for a liquid crystal panel substrate of a liquid crystal display apparatus of MVA mode.

More preferably, the entire part of the correction connection electrode is placed within the region where the alignment control projection or the electrode slit for adjusting alignment of liquid crystal molecules. The alignment control projection is formed from a photosensitive resin, for example. One example of the plan shape of the alignment control projection or the electrode slit (when viewed from the vertical direction of the substrate surface) may be a band bent in zigzags at certain intervals.

Moreover, since the correction connection electrode is formed under the electrode slit as an extended part of the retention capacitor, the fringe field effect of the electrode slit improves.

Further, the active matrix substrate according to the present invention is preferably arranged so that said pixel electrode includes a removal section where a pixel electrode material has been removed, said removal section including a portion overlapped with said branch sections.

In the pixel defect correction, the branch section is separated from the drain electrode, and then is connected into another branch section connected to a proper channel via the second conductive pattern section. In this process of cutting the branch section or conducting the branch section into the second conductive pattern section, a leak may occur in the pixel electrode above the branch section and the branch section connected to the channel with a leak (SD leak) between the source and drain.

However, with the foregoing arrangement in which the pixel electrode has a portion where the removal section, from which the electrode material has been removed, and the branch section are overlapped with each other; and the cutting of the branch section and the conduction of the branch section into the second conductive pattern section are performed at this portion. In this way, it is possible to prevent a leak in the pixel electrode and in the branch section connected to the SD leak channel.

More specifically, said removal section is positioned corresponding to said second conductive pattern section. With this arrangement, it is possible to prevent the leak in the pixel electrode and in the branch section connected to the SD leak channel upon the conduction of the branch section into the second conductive pattern section.

Further, said removal section is positioned corresponding to a portion at which said branch section is cut. With this arrangement, it is possible to prevent the leak in the pixel electrode and in the branch section connected to the SD leak channel upon the separation of the branch section.

Further preferably, said removal section is positioned corresponding to said second conductive pattern section and a portion at which said branch section is cut. With this arrangement, it is possible to more effectively prevent the leak in the pixel electrode and in the branch section connected to the SD leak channel.

Said removal section may be formed as a part of an alignment control electrode slit, which is formed on said pixel electrode, for adjusting alignment of liquid crystal molecules. As described above, the region where the alignment control electrode slit is formed does not normally function as a transmission region (opening section) in the liquid crystal display apparatus. Therefore, by using the alignment control electrode slit as the removal section, the decrease in aperture ratio by the provision of the removal section can be prevented.

Further, in the foregoing structure in which the pixel electrode has a removal section, it is preferable to provide a light-shielding film for shielding said removal section from light. With this arrangement, the part where the alignment of liquid crystal molecules is disturbed because of the removal section can be blocked from light. Consequently desirable display quality is obtained.

Note that, the light-shielding film does not necessarily have to be provided in the active matrix substrate, and may be provided in the counter substrate opposed to the active matrix substrate of the present invention, as long as the light-shielding film has a function of shielding the removal section from light when the display apparatus is viewed from the vertical direction of the substrate (liquid crystal panel).

The following explains the componential members of the active matrix substrate. One suitable example of the material of the substrate is a transparent insulating substance such as glass, plastic etc. The signal line (scanning signal line, data signal line), the gate electrode, the correction connection electrode, and the drain outgoing wire may be formed from a metal film such as titanium (Ti), chrome (Cr), aluminum (Al), molybdenum (Mo), tantalum (Ta), tungsten (W), copper (Cu), an alloy film of those, or a lamination film of those. Formations of the signal lines, the gate electrode, the correction connection electrode and the drain outgoing wires may be performed by depositing layers of the foregoing materials by sputtering or the like, and then patterning the layers into a target shape by photoetching or the like.

The source electrode and the drain electrode may be formed from a n+ amorphous silicon or the like doped with phosphor. The source electrode and the drain electrode are formed, for example, by depositing a layer using the foregoing material(s) by plasma CVD or the like, and separating the layer into source and drain by dry-etching or the like.

Among the following components in the groups (i) through (iii), the components in the same group are preferably formed in the same process from the same material. (i) the scanning signal lines, the gate electrode, and the correction connection electrode; (ii) the data signal lines and the drain outgoing wires; and (iii) the source electrode and the drain electrode. By thus forming them in one manufacturing process, the time and cost for manufacturing is reduced. The thicknesses of the signal lines, the gate electrode and the correction connection electrode are not limited. However, the thicknesses preferably fall within a range of about 1000 Å-3000 Å. The thickness of the source and drain electrodes is preferably about 500 Å.

The pixel electrode may be formed from a transparent conductive film of ITO, IZO, zinc oxide, tin oxide etc. The pixel electrode is formed, for example, by depositing a layer of the foregoing material(s) by sputtering or the like, and then patterning the layer into a target shape by photoetching or the like. One example of the shape of pixel electrode is a rectangle. The thickness of the pixel electrode is not limited. However, the thickness preferably falls within a range of about 1000 Å-2000 Å. The pixel electrode is preferably connected to the drain electrode or the wire section (drain outgoing wire) via a contact hole or the like formed on the interlayer insulating film.

The following is a lamination example of the active matrix substrate according to the present invention. From the lower to upper layers, (1) substrate, (2) scanning signal line, gate electrode, auxiliary capacitor wire, and second conductive pattern section (correction connection electrode), (3) (gate) insulating film, (4) high-resistance semiconductor layer, (5) source and drain electrodes, (6) data signal line and wire section (drain outgoing wire), (7) interlayer insulating film (including a contact hole), (8) pixel electrode.

With the display apparatus of the present invention containing the foregoing active matrix substrate, a pixel defect can be corrected easily and securely. Consequently, pixel defects are significantly reduced, and high display quality is ensured. Consequently the yield increases. The display apparatus of the present invention is particularly useful for, for example, a componential member of a large-sized liquid crystal TV which requires effective prevention of point defect.

For a liquid crystal display apparatus using technology of the present invention, the alignment control projection and/or the electrode slit for adjusting alignment of liquid crystal molecules are preferably formed on a counter substrate. This arrangement allows the display apparatus to achieve a wide viewing angle.

The present invention also provides a pixel defect correction method for an active matrix substrate, said active matrix substrate including an active element having at least one source electrode, two or more drain electrodes, and two or more channels, at least one of said drain electrodes is electrically connected to a pixel electrode via a wire section, said wire section (drain outgoing wire) includes a first conductive pattern section having a common section (drain outgoing wire common section) continuous to a pixel electrode and branch sections (drain outgoing wire branch section) each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer, said pixel defect correction method comprising the step of cutting at least one of said branch sections of a defective pixel at a portion between said overlapping portion and said common section.

According to this pixel defect correction method for an active matrix substrate, a pixel defect may be solved by cutting, for example, a branch section (drain outgoing wire branch section) corresponding to the channel in which a leak causing the pixel defect is happening, among the plural channels of the active element. Further, in the case of having some kind of defect (such as leak) between the branch section (drain outgoing wire branch section) and data signal line, the defect may be solved by electrically separating the branch section by cutting it off.

This is particularly effective when the portion having the leak is found by the appearance test or the like.

The pixel defect correction method for an active matrix substrate according to the present invention further comprises the steps of, in the case where the pixel defect cannot be solved by the step of cutting said branch section, electrically connecting a half branch section connected to said drain electrode resulted from the cutting step (i) into the other branch section(s) by conducting said second conductive pattern section into said other branch sections through said insulating layer so as to electrically connect the half branch section and the common section; and cutting at least one of said branch sections having not been cut.

This pixel defect correction method for an active matrix substrate allows effective pixel defect correction even when the defect cannot be solved by the cutting method, more specifically, the method in which the branch section (drain outgoing wire branch section) connected to the channel having the leak causing the pixel defect among the plural channels is cut, because the channel with the leak cannot be specified by the appearance test or the like. To be more specific, if it is confirmed by electric testing or the like that the pixel defect has not been solved even after the cutting of the branch section (drain outgoing wire branch section), the defective pixel can be corrected by the foregoing method.

The pixel defect correction method is preferably arranged so that the portion where said second conductive pattern section and said branch section(s) of said first conductive pattern section (correction connection electrode) are overlapped is irradiated with laser so that at least either one of the second conductive pattern or the branch section is melted, so as to conduct respective second conductive pattern sections through said insulating layer. With such a melting method, it is possible to easily and securely conduct the second conductive pattern section into the branch section(s).

Examples of suitable laser beam for the melting process include the second harmonic wave (wavelength=532 nm) of YAG (Yttrium Aluminum Garnet) laser.

The present invention also provides a method for manufacturing an active matrix substrate, said active matrix substrate including an active element having at least one source electrode, two or more drain electrodes, and two or more channels, at least one of said drain electrodes is electrically connected to a pixel electrode via a wire section, said wire section (drain outgoing wire) includes a first conductive pattern section having a common section (drain outgoing wire common section) continuous to a pixel electrode and branch sections (drain outgoing wire branch section) each of which extends from said common section and is broken into each of said drain electrodes, said active matrix substrate further including a second conductive pattern section which has an overlapping portion overlapped with said branch sections of said first conductive pattern section via an insulating layer, said second conductive pattern section (correction connection electrode) being electrically connectable to a plurality of said branch sections by being conducted to said overlapping portion through said insulating layer, said method performing pixel defect correction by carrying out the step of: (i) cutting at least one of said branch sections of a defective pixel at a portion between said overlapping portion and said common section.

With this manufacturing method for an active matrix substrate, it becomes possible to produce an active matrix substrate capable of sufficiently suppressing the pixel defect.

Said second conductive pattern section (correction connection electrode) is preferably formed by electrically separating a gate electrode conductive layer from at least one conductive layer.

In this manner of forming the second conductive pattern section (correction connection electrode) and the retention capacitor wire conductive layer from the same material, the manufacturing process can be simplified/shortened, and the manufacturing cost can be reduced.

Further, for a proper pixel without a pixel defect, the extended part of the retention capacitor wire can be used as a part of the retention capacitor element, or to increase the fringe field effect. The destruction of a part or the whole of the extension part of the retention capacitor wire can be performed by laser irradiation. Examples of suitable laser beam wavelength include the forth harmonic wave (wavelength=266 nm) of YAG laser.

Further, with the manufacturing method for an ac active matrix substrate of the present invention adopting the foregoing pixel defect correction method, it becomes possible to produce an active matrix substrate capable of sufficiently suppressing the pixel defect.

Further, with the manufacturing method for the display apparatus of the present invention, which adopts the foregoing pixel defect correction method or the manufacturing method for an active matrix substrate, pixel defects are significantly reduced. The present invention thus provides a display apparatus superior in display quality and yield.

Additional objects, features, and strengths of the present invention will be made clear by the description below. Further, the advantages of the present invention will be evident from the following explanation in reference to the drawings.

BRIEF DESCRIPTION OF DRAWINGS

[FIG. 27]
A schematic plan view showing a structure of a pixel in another active matrix substrate according to Sixth Embodiment.

REFERENCE NUMERALS

- 1,51: pixel electrode
- 1a: sub-pixel electrode
- 1b: sub-pixel electrode
- 2: scanning signal line
- 3: data signal line
- 4,4a,4b: active element (TFT)
- 5: gate electrode
- 6: source electrode (low-resistance semiconductor layer)
- 6a,6b,16a,16b drain electrode (low-resistance semiconductor layer)
- 7a,7b,7c: drain outgoing wire branch section (first conductive layer)
- 7d: drain outgoing wire common section (first conductive layer)
- 8: contact hole
- 9: correction connection electrode (second conductive layer)
- 9a: electrode (including correction electrode (second conductive layer))
- 11: gate insulating film (insulating layer)
- 21: retention capacitor upper electrode
- 22: retention capacitor wire (retention capacitor wire conductive layer)
- 30: electrode slit
- 83: removal section
- 84: light-shielding film
- 95: alternative path
- 96a: laser irradiation section (conductive section)
- 97a,97b: laser irradiation section (cut-off section)
- 99: defect
- 100: active matrix substrate
- 500: Y/C separation circuit
- 501: video chroma circuit
- 502: A/D converter
- 503: liquid crystal controller
- 504: liquid crystal panel
- 505: fluorescent tube drive circuit
- 506: backlight
- 507: microcomputer
- 508: gradation circuit
- 600: tuner section
- 501: display apparatus

BEST MODE FOR CARRYING OUT THE INVENTION

The following describes some concrete embodiments of the present invention. The present invention is however not limited to those embodiments.

FIRST EMBODIMENT

Figure 1:
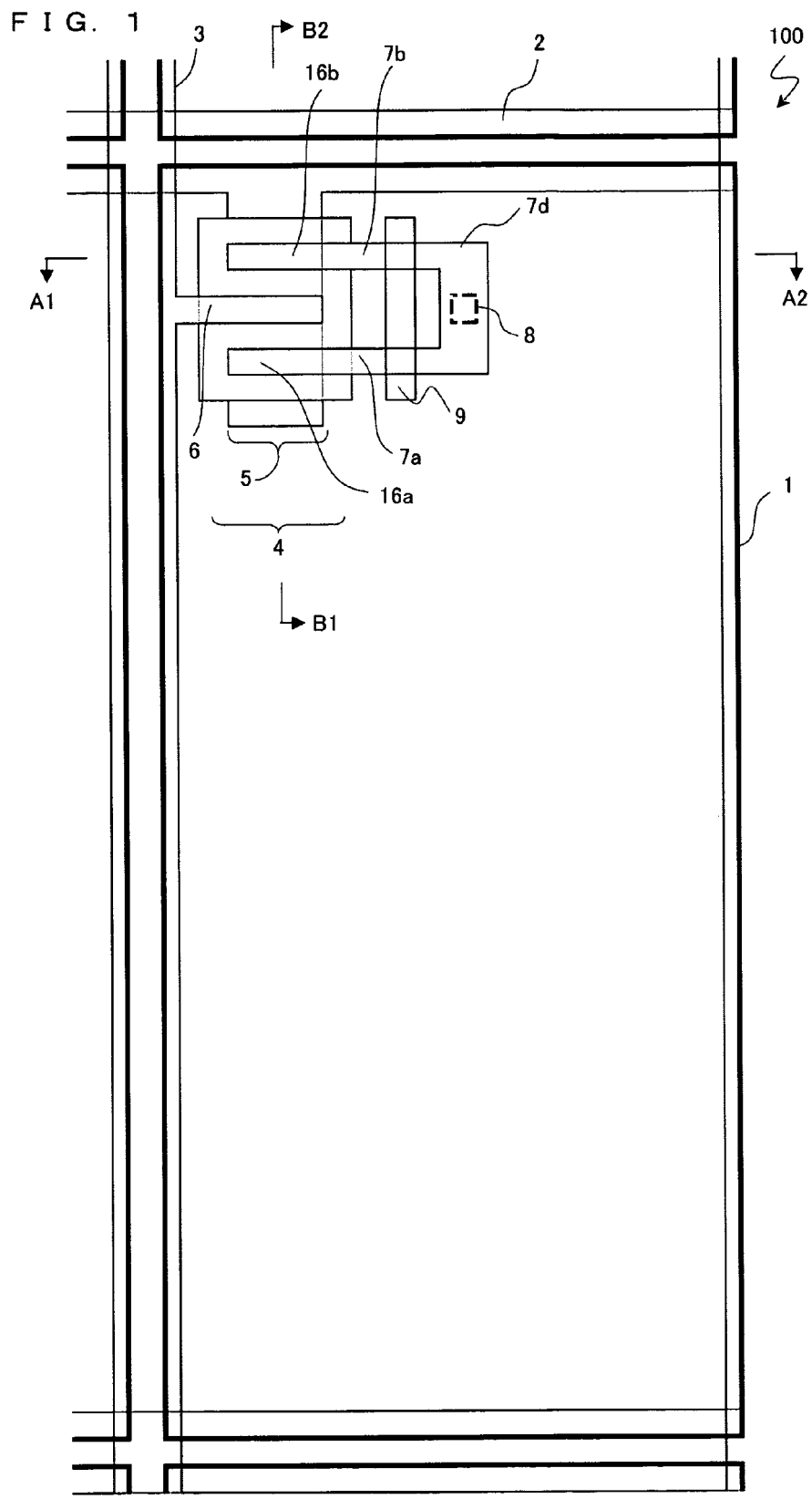
[FIG. 1]
A schematic plan view showing a structure of a pixel in an active matrix substrate according to First Embodiment.
Figure 2:
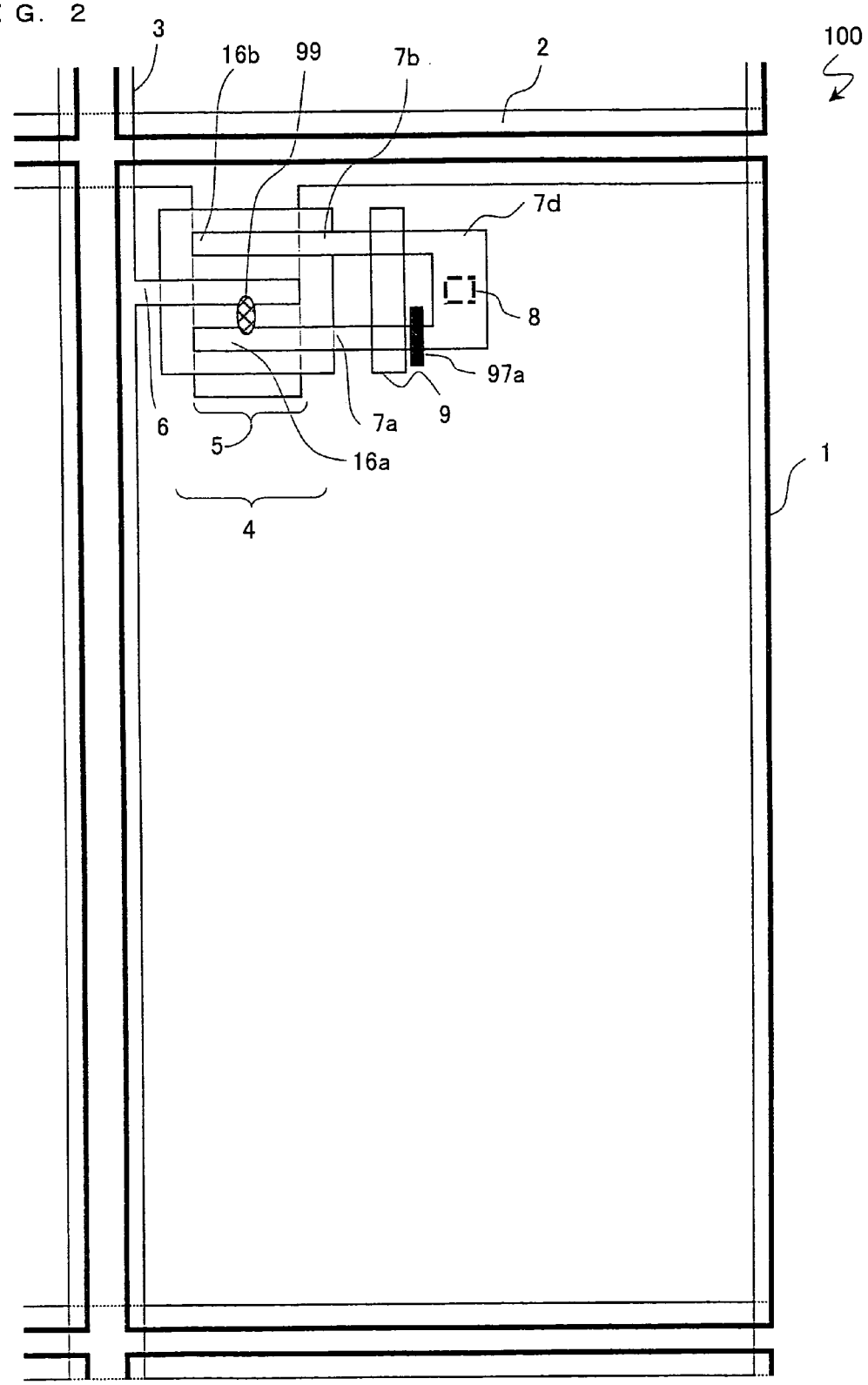
[FIG. 2]
Another schematic plan view showing a structure of a pixel in an active matrix substrate according to First Embodiment.
Figure 3:
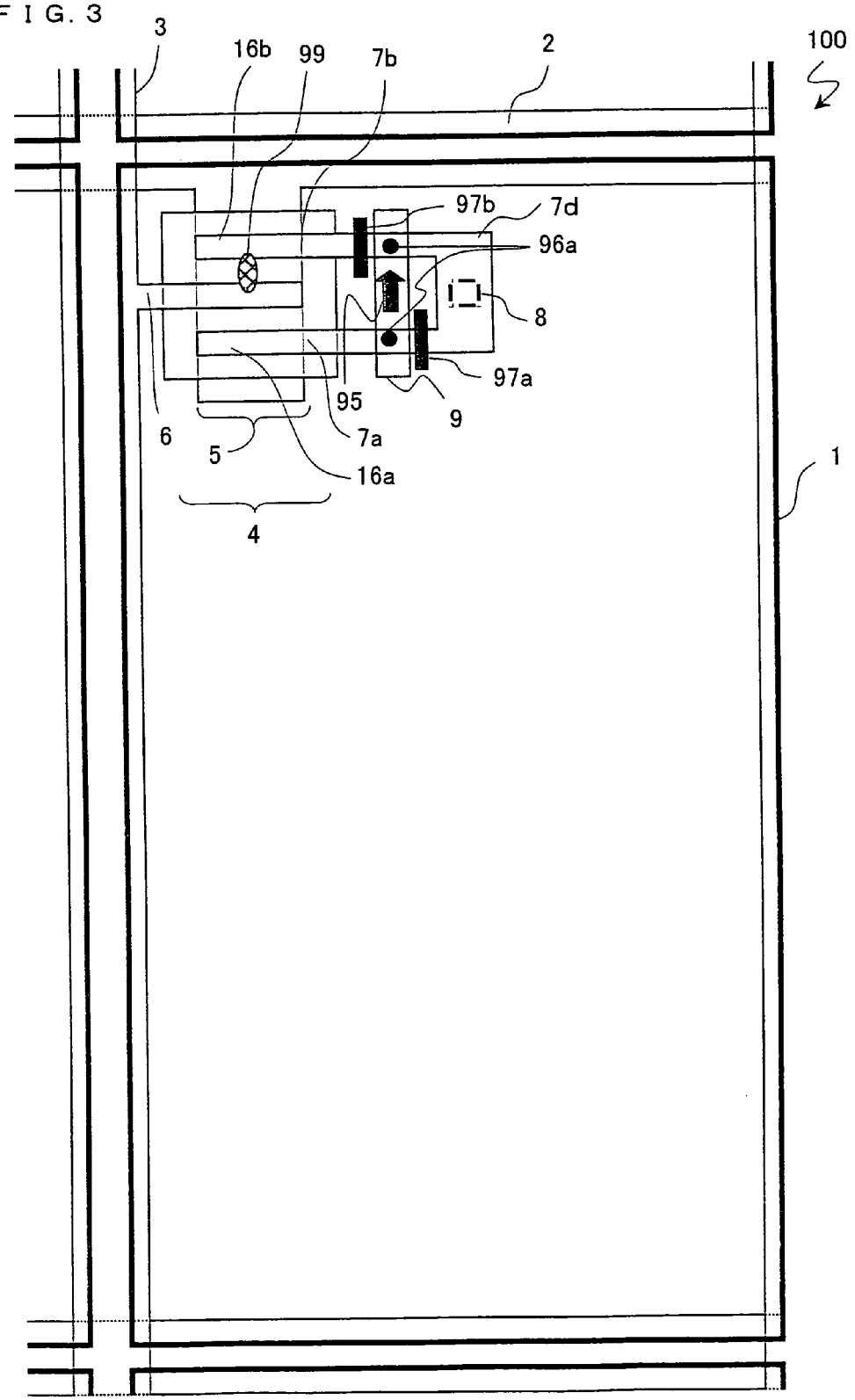
[FIG. 3]
Another schematic plan view showing a structure of a pixel in an active matrix substrate according to First Embodiment.
Figure 4:
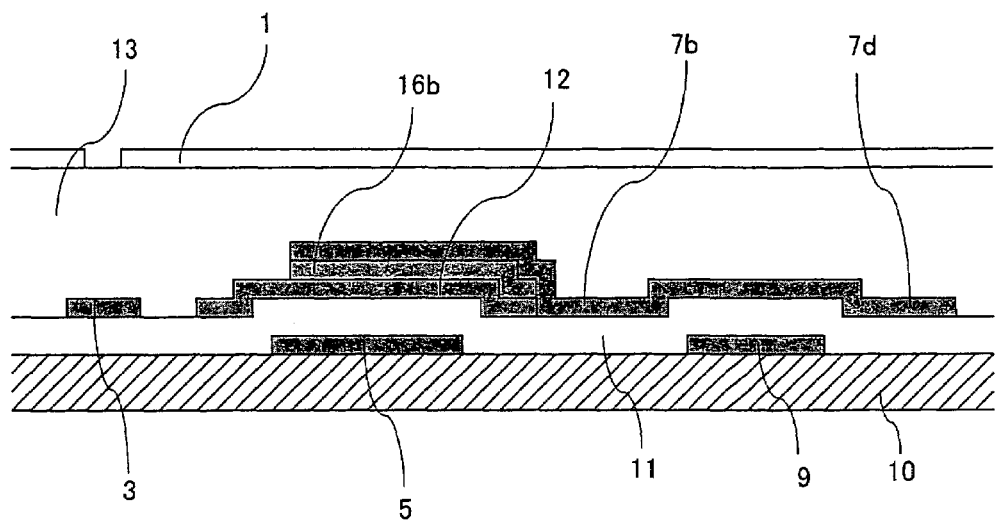
[FIG. 4]
A cross-sectional view, taken along the line A1-A2 in the active matrix substrate of FIG. 1.
Figure 5:
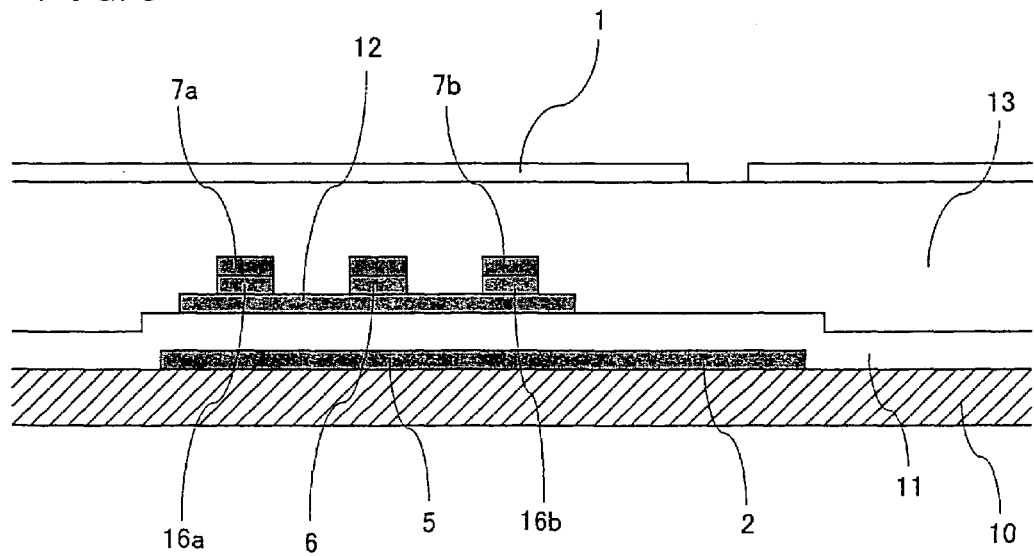
[FIG. 5]
A cross-sectional view, taken along the line B1-B2 in the active matrix substrate of FIG. 1.
Figure 6:
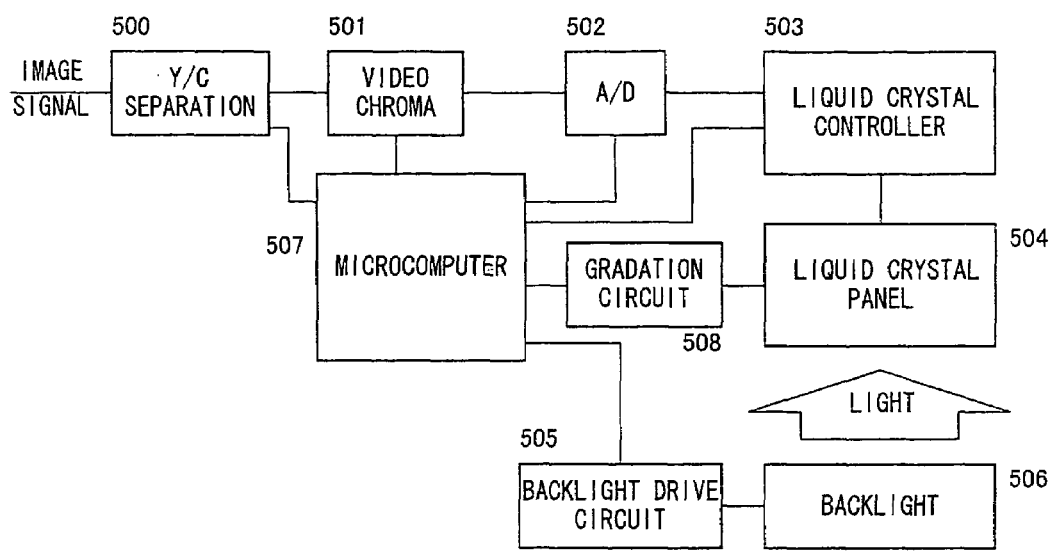
[FIG. 6]
A structure view of a display apparatus of First Embodiment.
Figure 7:
[FIG. 7]
A structure view of a television image receiver of First Embodiment.

One embodiment (First Embodiment) of the present invention is first described below with reference to FIGS. 1 through 7. FIGS. 1 through 3 are schematic plan views each showing a structure of a pixel in an active matrix substrate 100 according to First Embodiment. FIG. 1 shows a structure of a pixel in which pixel defect correction is not carried out, and FIGS. 2 and 3 show a structure of a pixel in which pixel defect has been corrected. FIG. 4 is a cross-sectional view, taken along the line A1-A2 of FIG. 1. FIG. 5 is a cross-sectional view, taken along the line B1-B2 of FIG. 1. FIG. 6 is a structure view of a display apparatus including an active matrix substrate according to the present embodiment. FIG. 7 shows a structure of a television image receiver including the display apparatus of FIG. 6.

As shown in FIGS. 1 through 3, a plurality of pixel electrodes 1 are arranged on an active matrix substrate 100 in matrix. In the vicinity of the pixel electrodes 1, the scanning signal lines 2 for supplying scanning signals and the data signal lines 3 for supplying data signals are provided. The scanning signal lines 2 and the data signal lines 3 intersect with each other. Each of the intersections of the scanning signal lines 2 and the data signal lines 3, a TFT 4 is provided so as to serve as an active element (switching element).

The TFT 4 serving as an active element includes a gate electrode 5 connected to a scanning line 2 and a source electrode 6 connected to the data signal line 3, and drain electrodes 16a and 16b. Further, the drain electrodes 16a and 16b are connected to drain outgoing wires 7a, 7b and 7c serving as a first conductive pattern section made of a conductive layer constituting a wire section. The drain outgoing wire made up of an outgoing wire common section 7d and the drain outgoing wire branch sections 7a and 7b which respectively extend into the drain electrodes 16a and 16b.

The drain outgoing wire common section 7d is connected to the pixel electrode 1 via a contact hole 8. The active matrix substrate according to the present embodiment further includes a correction connection electrode 9 (second conductive pattern section), which is partly (150 µm$^2$) overlapped with each of the outgoing wire branch sections 7a and 7b via the insulating layer. The correction connection electrode 9 is connectable to either or both of the branch section 7a and 7b, penetrating through the insulating layer.

In the structure of FIG. 1, neither of the drain electrode 16a nor the drain electrode 16b have defect, and therefore the pixel defect correction is not carried out. Accordingly, in this pixel, the correction connection electrode 9 does not serve as a wire section for connecting the drain electrodes 16a and 16b into the pixel electrode 1.

The operation of the TFT 4 is controlled by scanning signals supplied to the gate electrode 5, and the pixel electrode 1 is supplied with an intended level of voltage as a data signal is supplied to the source electrode 6.

The following explains a cross-sectional structure and a basic part of manufacturing of the active matrix substrate according to the present embodiment, with reference to FIGS. 1, 4 and 5. FIG. 4 is a cross-sectional view, taken along the line A1-A2 in the active matrix substrate shown in FIG. 1. FIG. 5 is a schematic cross-sectional view, taken along the line B1-B2 of FIG. 1. As shown in FIGS. 4 and 5, in the present embodiment, a gate electrode 5 is connected to a scanning line 2 on a transparent insulating substrate 10, which is made of glass, plastic or the like. The scanning signal line 2 and the gate electrode 5 are formed from a metal film such as titanium, chrome, aluminum, molybdenum, tantalum, tungsten, copper, an alloy film of those, or a lamination film of those. A 1000 Å-3000 Å thick film is deposited by sputtering or the like, and is patterned into a target shape by photoetching or the like. Further, the correction connection electrode 9 is also formed in this process for forming the scanning signal line 2 and the gate electrode 5. By thus forming them in the same manufacturing process, the time and cost for manufacturing is reduced. The correction connection electrode 9 is formed to be overlapped with the drain outgoing wire branch section 7a and 7b, which are formed above the correction connection electrode 9 in a later process.

The active matrix substrate of the present embodiment also includes a gate insulating film 11 which covers all of the scanning signal line 2, gate electrode 5 and correction connection electrode 9. The gate insulating film 11 is formed from an insulating film of silicon nitride, silicon oxide or the like. On the gate insulating film 11, a high-resistance semiconductor layer 12 made of amorphous silicon, polysilicon etc. is formed to be overlapped with the gate electrode 5. Further, a low-resistance semiconductor layer is formed as an ohmic contact layer. The low-resistance semiconductor layer is formed from n+ amorphous silicon or the like doped with phosphor, and is formed into the source electrode 6 and the drain electrodes 16a and 16b. The gate insulating film 11 made of silicon nitride, silicon oxide etc., a high-resistance semiconductor layer 12 made of amorphous silicon or the like, the low-resistance semiconductor layers 6, 16a and 16b made of n+ amorphous silicon or the like are all deposited by plasma CVD (chemical vapor deposition), and are pattern into corresponding shapes by photoetching or the like. The thicknesses of the silicon nitride film to be the gate insulating film 11, the amorphous silicon film to be the high-resistance semiconductor layer 12, and the n+ amorphous silicon film to be the low-resistance semiconductor layers 6, 16a and 16b are about 3000 Å-5000 Å, 1000 Å-3000 Å and 400 Å-700 Å, respectively.

The data signal line 3, the drain outgoing wire branch sections 7a and 7b, and the drain outgoing wire common section 7d are all formed in the same manufacturing process. The data signal line 3, the drain outgoing wire branch sections 7a and 7b, and the drain outgoing wire common section 7d are formed from a metal film such as titanium, chrome, aluminum, molybdenum, tantalum, tungsten, copper, an alloy film of those, or a lamination film of those. A 1000 Å-3000 Å thick film is deposited by sputtering or the like, and is patterned into a target shape by photoetching or the like. The high-resistance semiconductor layer 12 made of amorphous silicon or the like, and the low-resistance semiconductor layers 6, 16a and 16b made of n+ amorphous silicon or the like are subjected to channel etching by way of dry etching, using the patterns of the data signal line 3 and the drain outgoing wire branch section 7a and 7b as masks. The TFT is thus completed.

The active matrix substrate according to the present embodiment includes an interlayer insulating film 13, which is made of a resin film made of photosensitive acrylic resin or the like, an inorganic insulating film made of silicon nitride, silicon oxide etc., or a lamination film of those. The lamination film may be made by overlaying a 20000 Å-40000 Å thick photosensitive acrylic resin film on an about 2000 Å-5000 Å thick silicon nitride film deposited by CVD or the like, by way of die-coating.

In the present embodiment, the contact hole is so formed as to penetrate through the interlayer insulating film 13 which is layered on the TFT, the scanning signal line 2, the data signal line 3, the drain outgoing wire branch sections 7a and 7b, and the drain outgoing wire common section 7d. The contact hole is formed by patterning a photosensitive acrylic resin by photolithography (exposure and development), for example.

In the present embodiment, the pixel electrode 1 is formed above the interlayer insulating film 13. One example of formation of pixel electrode 1 is depositing an about 1000 Å-2000 Å thick transparent conductive film from ITO, IZO, zinc oxide, tin oxide etc. by sputtering or the like, and then patterning the conductive film into a target shape by photoetching or the like.

The following explains a pixel defect correction method according to the present embodiment. FIG. 2 shows a pixel which has been through defect correction to solve a defect (such as leak) in the drain electrode 16a due to the residue film defect 99 between the source electrode 6 and the drain electrode 16a. In this case, the pixel defect was corrected by cutting the portion 97a of the drain outgoing wire branch section 7a. The portion 97a resides between the drain outgoing wire common section 7d and a portion where the drain outgoing wire branch section 7a is overlapped with the correction connection electrode 9.

This pixel defect correction can be carried out by finding out, prior to cutting the branch section, whether the defect exists in the drain electrode 16a or in the drain electrode 16b by the appearance test. Also, in the case where it is already known, by an electric testing or the like, that the defect exists at least either of the drain electrode 16a or the drain electrode 16b, one of the branch sections is cut and another electric testing is performed. If the pixel defect is solved by the cutting, the resulting pixel will look like one in FIG. 2. In this case, the drain outgoing wire branch section 7a is cut at the portion 97a which resides between the drain outgoing wire common section 7d and a portion where the drain outgoing wire branch section 7a is overlapped with the correction connection electrode 9. Therefore if the defect part was not found before carrying out cutting of the branch section, and the drain electrode 16a was found not to have the defect, the connection between the branch section 7a and the common 7d can be easily recovered through the correction connection electrode 9. This is described later in detail with reference to FIG. 3.

In the pixel of FIG. 2, the drain electrode 16a is blocked from electricity, and the drain electrode 16b is connected to the outgoing wire common section 7d via the outgoing wire branch section 7b, and the drain outgoing wire common section 7d is connected to the pixel electrode 1 via the contact hole 8. In the pixel of FIG. 2, the correction connection electrode 9 does not serve as a wire for connecting the drain electrode 16b to the pixel electrode 1.

FIG. 3 shows a pixel which has been through defect correction to solve a defect (such as leak) in the drain electrode 16b due to the residue film defect 99 between the source electrode 6 and the drain electrode 16b. In this case, the pixel defect was corrected by cutting the portion 97a of the drain outgoing wire branch section 7a and the portion 97b of the drain outgoing wire branch section 7b. The portion 97a resides between the drain outgoing wire common section 7d and a portion where the drain outgoing wire branch section 7a is overlapped with the correction connection electrode 9, and the portion 97b resides between the drain electrode 16b and a portion where the drain outgoing wire branch section 7b is overlapped with the correction connection electrode 9. Then both of the drain outgoing wire branch sections 7a and 7b are electrically connected to the correction connection electrode 9 through the insulating layer at the portion 96a.

This pixel defect correction is performed in the following case. It is already known, by an electric testing or the like, that the defect exists at least either of the drain electrode 16a or the drain electrode 16b, and one of the branch sections is cut. However, according to the subsequent electric testing, the defect was not corrected. In this case, it can be assumed that the defect does not exist in the drain electrode having been cut. Therefore, the conduction between the common section and the branch section having been cut is recovered through the correction connection electrode. Then the other branch section is cut.

In the pixel of FIG. 3, the drain electrode 16b is blocked from electricity, and the drain electrode 16a is connected to the drain outgoing wire common section 7d via the drain outgoing wire branch section 7a, the correction connection electrode 9 and the drain outgoing wire branch section 7b, through the alternative path 95. Then, the drain outgoing wire common section 7d is connected to the pixel electrode 1 via the contact hole 8.

In the present embodiment, the drain outgoing wire branch section is divided by breaking the cut-off sections 97a and 97b with laser beam irradiation. The laser beam is emitted to the cut-off sections 97a and 97b through either the front or rear surface of the substrate. Examples of suitable laser beam wavelength include the forth harmonic wave (wavelength=266 nm) of YAG laser. Further, to conduct the drain outgoing wire branch section and the correction connection electrode, the conduction portion 96a is irradiated with a laser beam through either the front or rear surface of the substrate. Examples of suitable laser beam wavelength include the second harmonic wave (wavelength=532 nm) of YAG laser.

Note that, in the present embodiment, the pattern shape of the correction connection electrode 9 is rectangular (quadrangle) as shown in FIGS. 1 through 3. However, the pattern shape of the correction connection electrode 9 is not limited to this, and may be a triangle, a hemicycle or a trapezoid. More specifically, it is preferable that a part of the correction connection electrode 9 be so formed as to overlap the patterns of the drain outgoing wire branch section 7a and 7b via a gate insulating film, and ensure a portion to be subjected to laser irradiation. For example, an alternative path such as 95 in FIG. 3 is preferably provided. Further, the location of the portion where the correction connection electrode and the drain outgoing wire branch section are overlapped is not particularly limited.

The pixel defect correction according to the present embodiment is basically performed after at least a pixel electrode is formed. However, in applying this method to a liquid crystal display apparatus, it is more preferable to carry out the correction after the liquid crystal layer is formed so as to confirm lighting of panel. In this way, the channel causing leak can be securely removed electrically, and an alternative path can be provided. More specifically, the correction is preferably carried out after the active matrix substrate is bonded with a color filter substrate, and liquid crystal is injected and sealed in the substrate to complete a panel. However, the timing of correction is not strictly limited to this, and the present embodiment also includes a correction carried out after the channel etching, which is performed after the drain outgoing wires 7a, 7b, and 7d are formed.

FIG. 6 shows a circuit block of a liquid crystal display apparatus. In FIG. 6, the reference numeral 500 denotes a Y/C separation circuit. Similarly, 501 denotes a video chroma circuit, 502 denotes a A/D converter, 503 denotes a liquid crystal controller, 504 denotes a liquid crystal panel, 505 denotes a backlight drive circuit, 506 denotes a backlight, 507 denotes a microcomputer, and 508 denotes a gradation circuit. The liquid crystal panel is constituted of the active matrix substrate according to the present embodiment.

An input image signal of television signal is supplied to the Y/C separation circuit 500 so as to be broken into a luminance signal and a color signal. The luminance signal and a color signal are converted into three primary colors R, G and B in the video chroma circuit 501. The analog signal is further converted into a digital signal in the A/D converter 502, before supplied to the liquid crystal controller 503.

The liquid crystal panel 504 is supplied with RGB signals from the liquid crystal controller 503 at predetermined timings, and also is supplied with respective voltages of R, G and B from the gradation circuit 508. As a result, an image is displayed. Including these processes, the control of the entire system is carried out by the microcomputer 507.

Such image display may be carried out in accordance with various video signals, such as video signals of television broadcast, video signals captured by a camera, or video signals supplied through the Internet lines.

Further, the tuner section 600 shown in FIG. 7 receives a television broadcast and outputs video signals, and the display apparatus 601 carries out image (video picture) display in accordance with the video signals transmitted from the tuner section 600. Note that, the liquid crystal display apparatus shown in FIG. 6 may be used as the display apparatus. The display apparatus may also be realized by other types of display apparatus such as an organic EL display apparatus. Further, the display apparatus and the television image-receiver according to the present embodiment may also be constituted of the respective active matrix substrates described in the following Second to Fourth Embodiments.

SECOND EMBODIMENT

Figure 8:
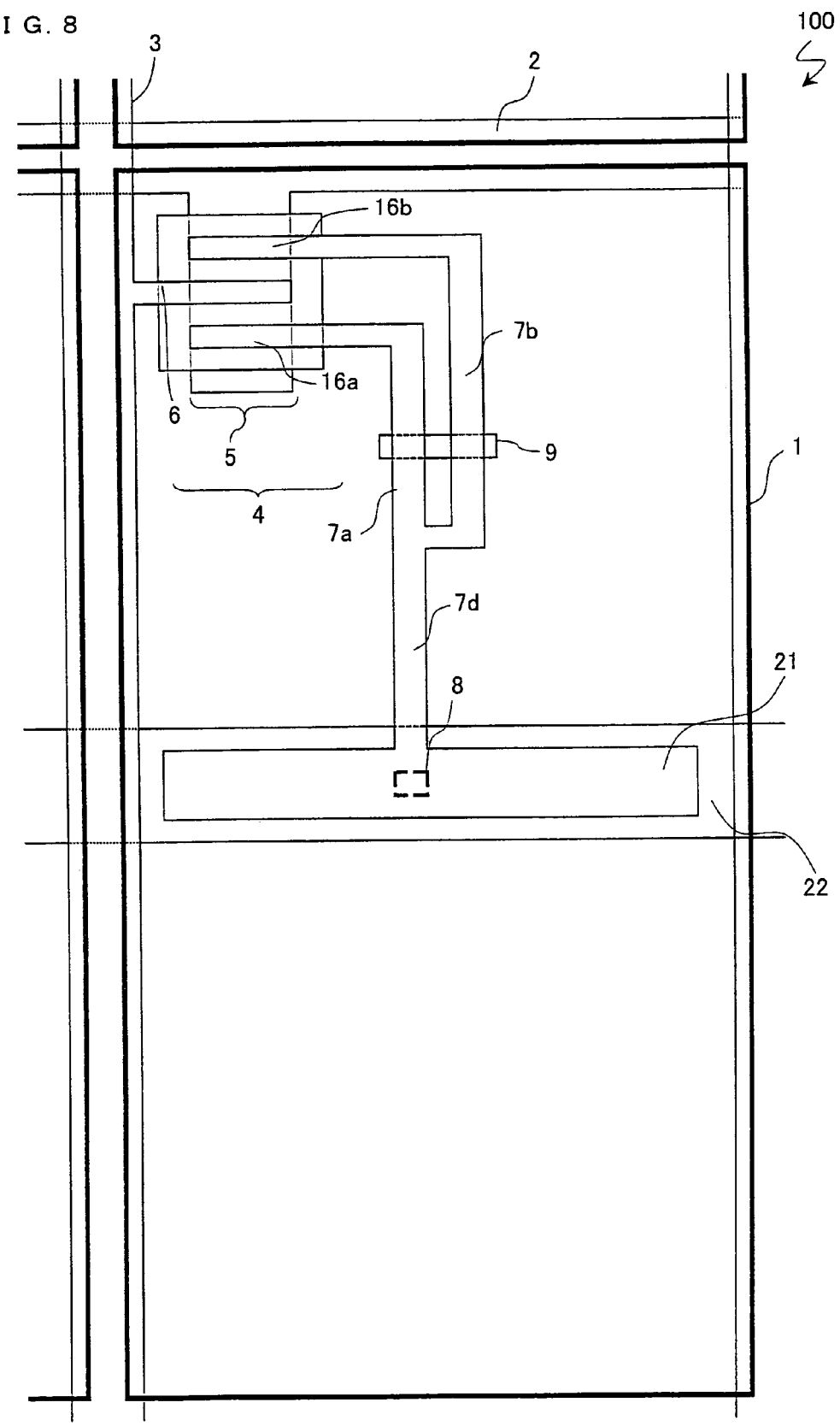
[FIG. 8]
A schematic plan view showing a structure of a pixel in an active matrix substrate according to Second Embodiment.
Figure 9:
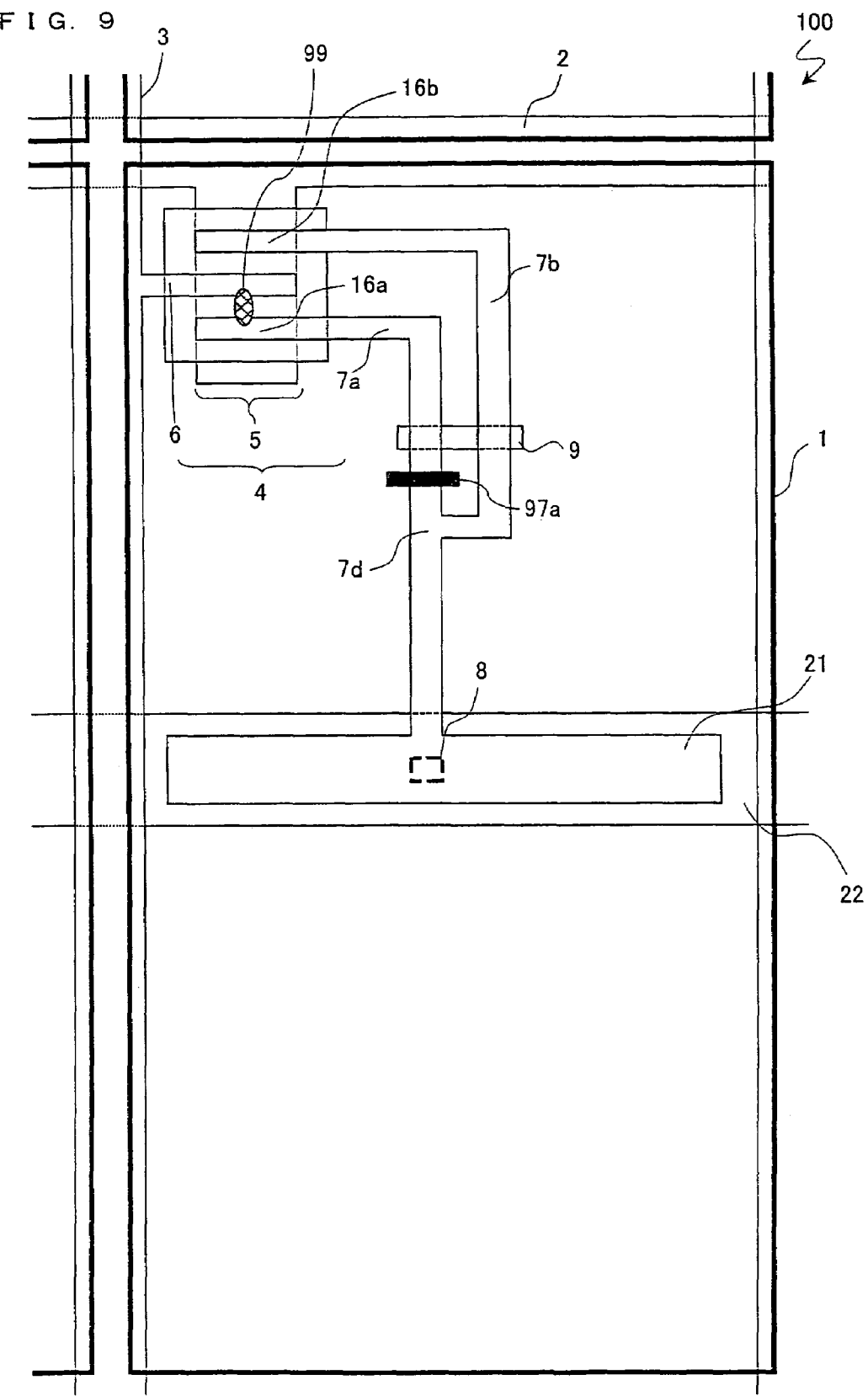
[FIG. 9]
Another schematic plan view showing a structure of a pixel in an active matrix substrate according to Second Embodiment.
Figure 10:
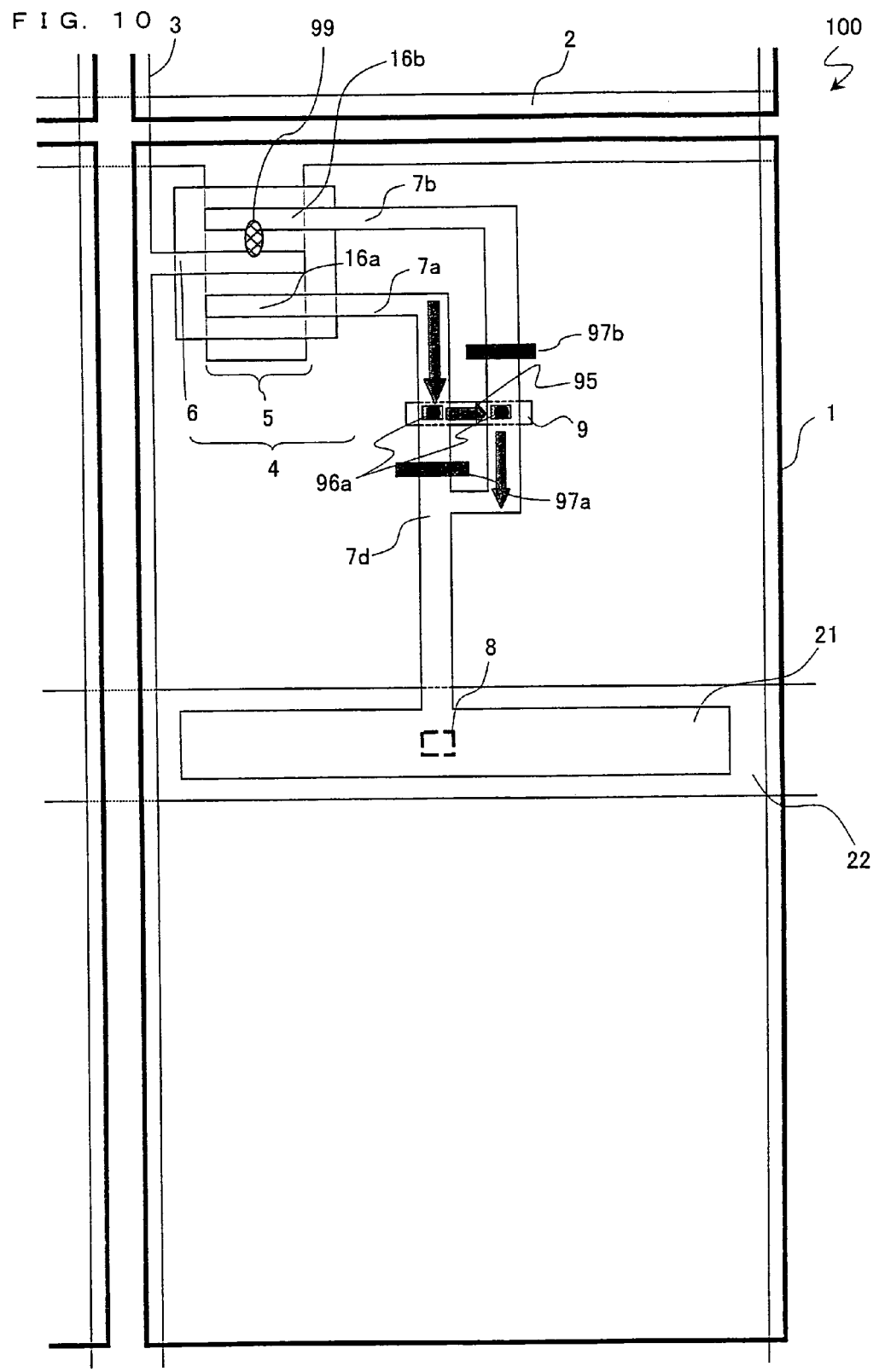
[FIG. 10]
Another schematic plan view showing a structure of a pixel in an active matrix substrate according to Second Embodiment.

The following describes another embodiment (Second Embodiment) of the present invention with reference to FIGS. 8 through 10. FIGS. 8 through 10 are schematic plan views showing a structure of a pixel in an active matrix substrate 100 according to Second Embodiment. FIG. 8 shows a structure of a pixel in which a pixel defect is not corrected. FIGS. 9 and 10 show a structure of a pixel having been subjected to pixel defect correction.

As shown in FIGS. 8 through 10, the active matrix substrate 100 includes a plurality of pixel electrodes 1 arranged in matrix, in the vicinity of the pixel electrodes 1, the scanning signal lines 2 for supplying scanning signals and the data signal lines 3 for supplying data signals are provided. The scanning signal lines 2 and the data signal lines 3 intersect with each other. Each of the intersections of the scanning signal lines 2 and the data signal lines 3, a TFT 4 is provided so as to serve as an active element (active element).

The TFT 4 serving as an active element includes a gate electrode 5 connected to a scanning line 2 and a source electrode 6 connected to the data signal line 3, and drain electrodes 16a and 16b. The drain electrodes 16a and 16b are connected to the drain outgoing wires 7a, 7b, and 7d (first conductive pattern section) made of a conductive layer constituting a wire section. The drain outgoing wire made up of an outgoing wire common section 7d and the drain outgoing wire branch sections 7a and 7b which respectively extend into the drain electrodes 16a and 16b.

The drain outgoing wire common section 7d is connected to the pixel electrode 1 via a contact hole 8 and one of the electrodes (retention capacitor upper electrode) 21 of the retention capacitor element. The retention capacitor wire 22 serves as the other electrode (retention capacitor lower electrode) of the retention capacitor element. The active matrix substrate according to the present embodiment further includes a correction connection electrode 9, which is partly (150 μm²) overlapped with each of the outgoing wire branch sections 7a and 7b via the insulating layer. The correction connection electrode 9 is connectable to either or both of the branch section 7a and 7b, penetrating through the insulating layer.

In the structure of FIG. 8, neither of the drain electrode 16a nor the drain electrode 16b have defect, and therefore the pixel defect correction is not carried out. Accordingly, in this pixel, the correction connection electrode 9 does not serve as a wire section for connecting the drain electrodes 16a and 16b into the pixel electrode 1.

Note that, the members constituting the cross-section of the active matrix substrate of the present embodiment are the same as those in First Embodiment, and therefore explanation thereof will be omitted here.

FIG. 9 shows a pixel which has been through defect correction to solve a defect (such as leak) in the drain electrode 16a due to the residue film defect 99 between the source electrode 6 and the drain electrode 16a. In this case, the pixel defect was corrected by cutting the portion 97a of the drain outgoing wire branch section 7a. The portion 97a resides between the drain outgoing wire common section 7d and a portion where the drain outgoing wire branch section 7a is overlapped with the correction connection electrode 9.

This pixel defect correction can be carried out by finding out, prior to cutting the branch section, whether the defect exists in the drain electrode 16a or in the drain electrode 16b by the appearance test. Also, in the case where it is already known, by an electric testing or the like, that the defect exists at least either of the drain electrode 16a or the drain electrode 16b, one of the branch sections is cut and another electric testing is performed. If the pixel defect is solved by the cutting, the resulting pixel will look like one in FIG. 9. In this case, the drain outgoing wire branch section 7a is cut at the portion 97a which resides between the drain outgoing wire common section 7d and a portion where the drain outgoing wire branch section 7a is overlapped with the correction connection electrode 9. Therefore if the defect part was not found before carrying out cutting of the branch section, and the drain electrode 16a was found not to have the defect, the connection between the branch section 7a and the common 7d can be easily recovered through the correction connection electrode 9. This is described later in detail with reference to FIG. 10.

In the pixel of FIG. 9, the drain electrode 16a is blocked from electricity, and the drain electrode 16b is connected to the outgoing wire common section 7d via the outgoing wire branch section 7b, and the drain outgoing wire common section 7d is connected to the pixel electrode 1 via the contact hole 8. In the pixel of FIG. 9, the correction connection electrode 9 does not serve as a wire for connecting the drain electrode 16b to the pixel electrode 1.

FIG. 10 shows a pixel which has been through defect correction to solve a defect (such as leak) in the drain electrode 16b due to the residue film defect 99 between the source electrode 6 and the drain electrode 16b. In this case, the pixel defect was corrected by cutting the portion 97a of the drain outgoing wire branch section 7a and the portion 97b of the drain outgoing wire branch section 7b. The portion 97a resides between the drain outgoing wire common section 7d and a portion where the drain outgoing wire branch section 7a is overlapped with the correction connection electrode 9, and the portion 97b resides between the drain electrode 16b and a portion where the drain outgoing wire branch section 7b is overlapped with the correction connection electrode 9. Then both of the drain outgoing wire branch sections 7a and 7b are electrically connected to the correction connection electrode 9 through the insulating layer at the portion 96a.

This pixel defect correction is performed in the following case. It is already known, by an electric testing or the like, that the defect exists at least either of the drain electrode 16a or the drain electrode 16b, and one of the branch sections is cut. However, according to the subsequent electric testing, the defect was not corrected. In this case, it can be assumed that the defect does not exist in the drain electrode having been cut. Therefore, the conduction between the common section and the branch section having been cut is recovered through the correction connection electrode. Then the other branch section is cut.

In the pixel of FIG. 10, the drain electrode 16b is blocked from electricity, and the drain electrode 16a is connected to the drain outgoing wire common section 7d via the drain outgoing wire branch section 7a, the correction connection electrode 9 and the drain outgoing wire branch section 7b, through the alternative path 95. Then, the drain outgoing wire common section 7d is connected to the pixel electrode 1 via the contact hole 8 and one of the electrodes (retention capacitor upper electrode) 21 of the retention capacitor element.

In the present embodiment, the drain outgoing wire branch section is divided by breaking the cut-off sections 97a and 97b with laser beam irradiation. The laser beam is emitted to the cut-off sections 97a and 97b through either the front or rear surface of the substrate. Examples of suitable laser beam wavelength include the forth harmonic wave (wavelength=266 nm) of YAG laser. Further, to conduct the drain outgoing wire branch section and the correction connection electrode, the conduction portion 96a is irradiated with a laser beam through either the front or rear surface of the substrate. Examples of suitable laser beam wavelength include the second harmonic wave (wavelength=532 nm) of YAG laser.

Note that, in the present embodiment, the pattern shape of the correction connection electrode 9 is rectangular (quadrangle) as shown in FIGS. 8 through 10. However, the pattern shape of the correction connection electrode 9 is not limited to this, and may be a triangle, a hemicycle or a trapezoid. More specifically, it is preferable that a part of the correction connection electrode 9 be so formed as to overlap the patterns of the drain outgoing wire branch section 7a and 7b via a gate insulating film, and ensure a portion to be subjected to laser irradiation. For example, an alternative path such as 95 in FIG. 10 is preferably provided. Further, the location of the portion where the correction connection electrode and the drain outgoing wire branch section are overlapped is not particularly limited.

The pixel defect correction according to the present embodiment is basically performed after at least a pixel electrode is formed. However, in applying this method to a liquid crystal display apparatus, it is more preferable to carry out the correction after the liquid crystal layer is formed so as to confirm lighting of panel. In this way, the channel causing leak can be securely removed electrically, and an alternative path can be provided. However, the timing of correction is not strictly limited to this, and the present embodiment also includes a correction carried out after the channel etching, which is performed after the drain outgoing wires 7a, 7b, and 7d are formed.

THIRD EMBODIMENT

Figure 11:
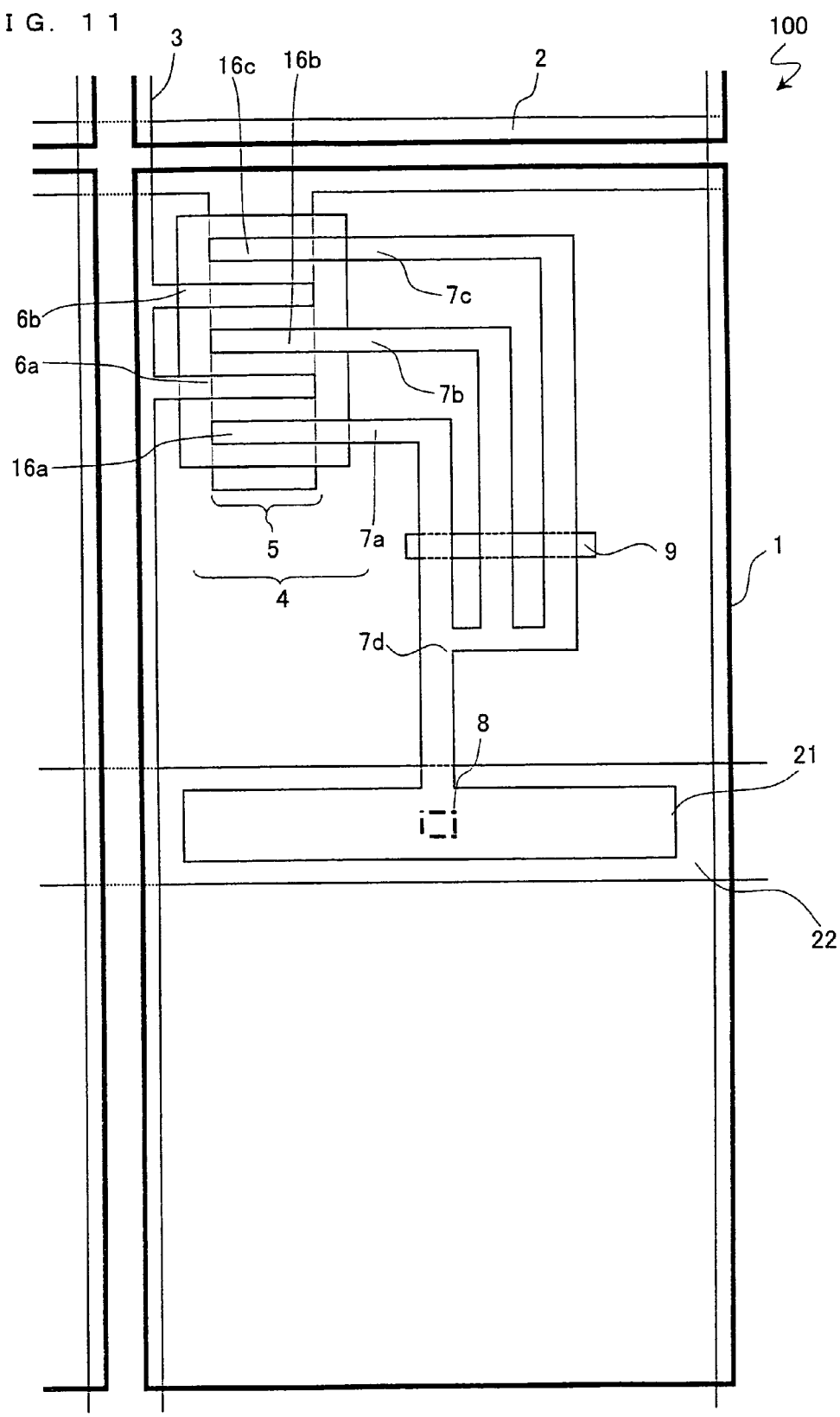
[FIG. 11]
A schematic plan view showing a structure of a pixel in an active matrix substrate according to Third Embodiment.
Figure 12:
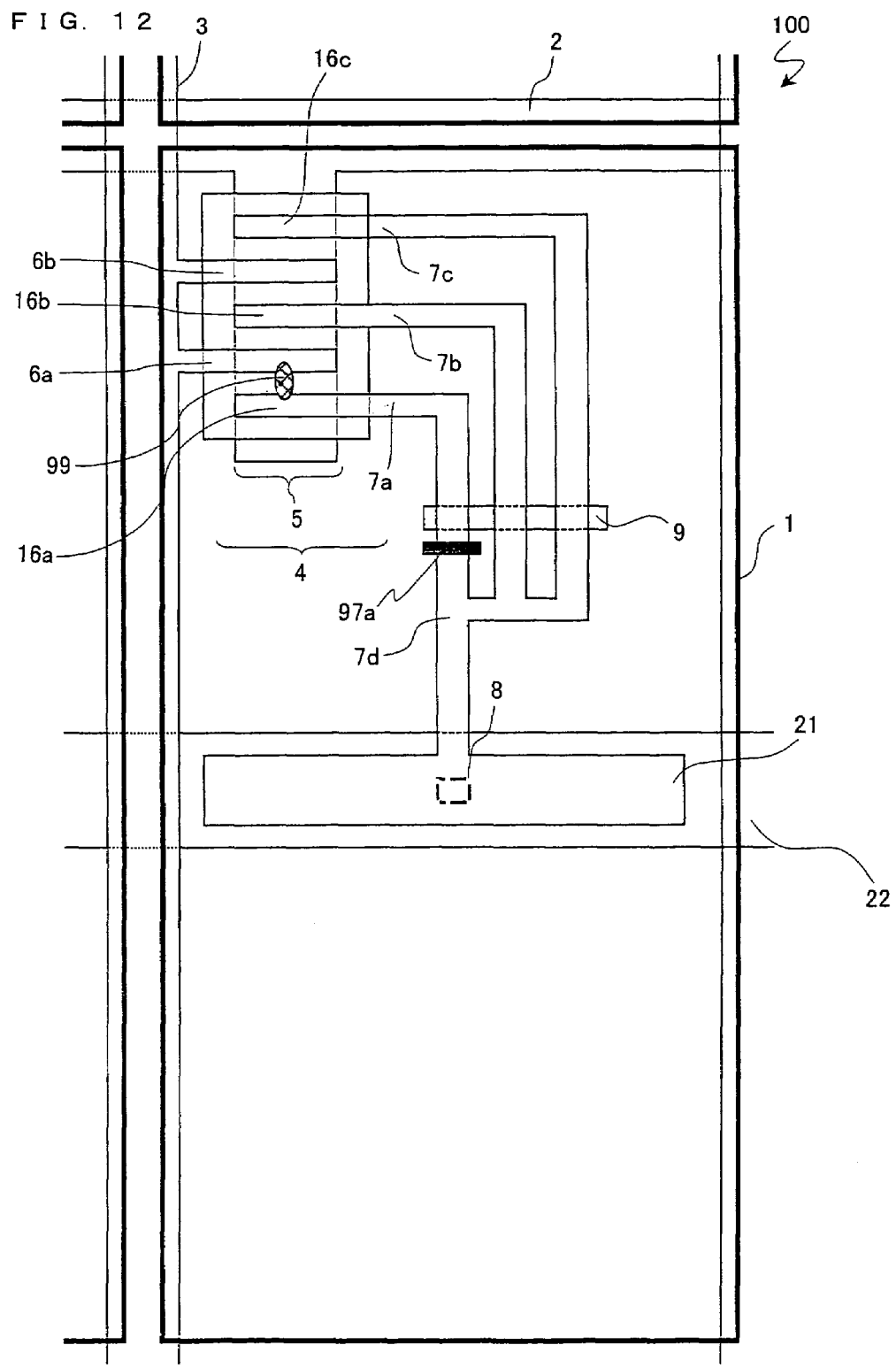
[FIG. 12]
Another schematic plan view showing a structure of a pixel in an active matrix substrate according to Third Embodiment.
Figure 13:
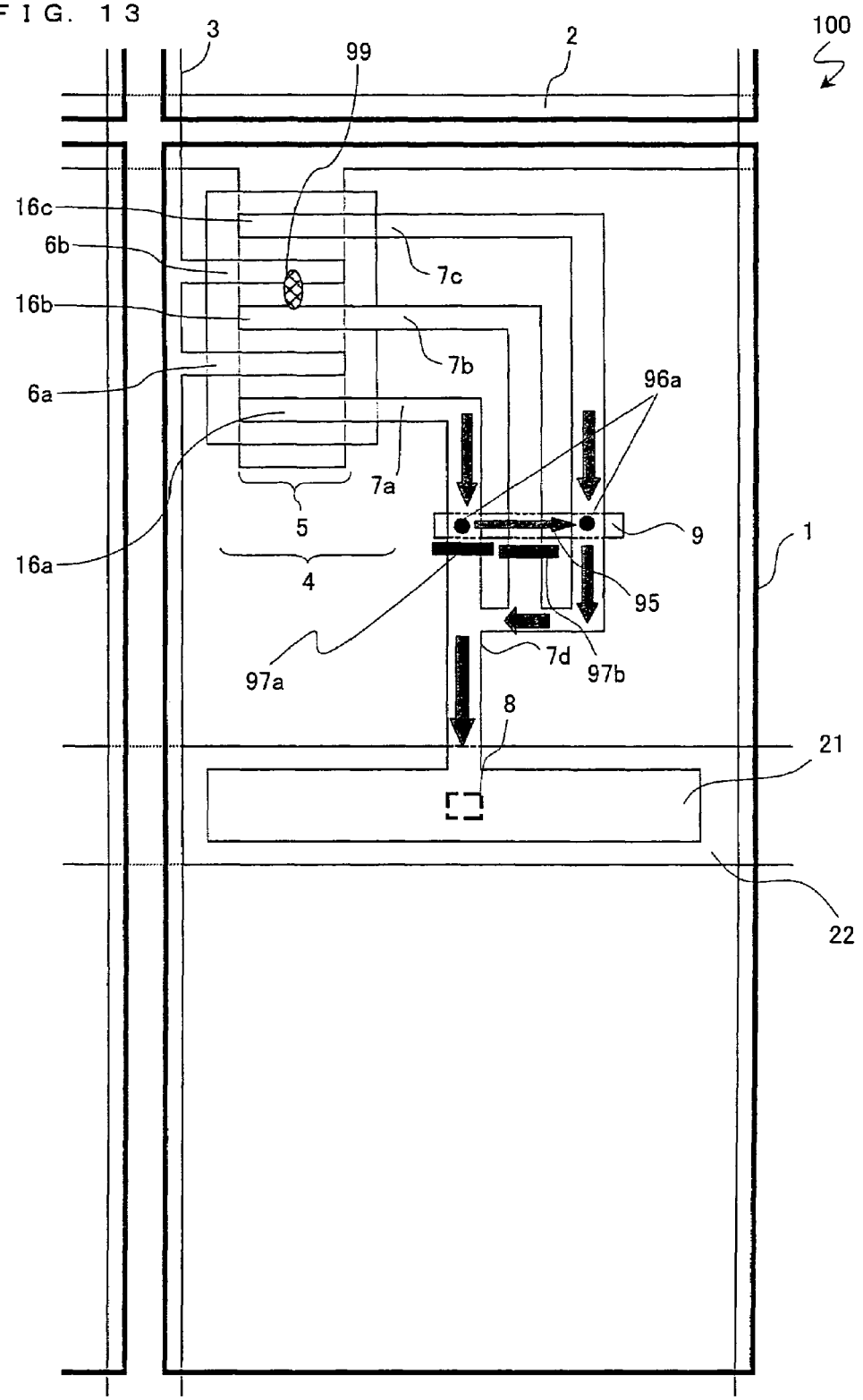
[FIG. 13]
Another schematic plan view showing a structure of a pixel in an active matrix substrate according to Third Embodiment.
Figure 14:
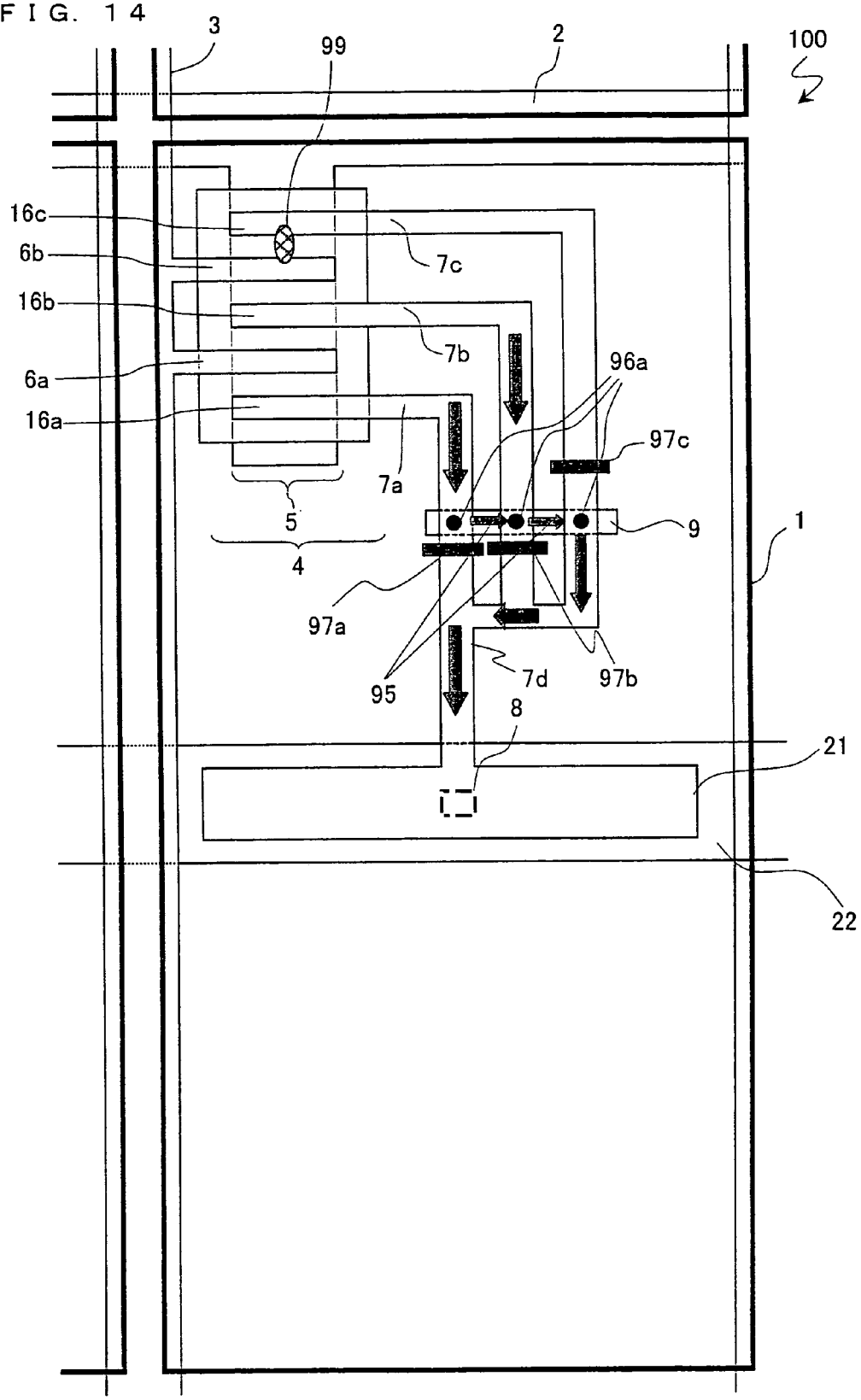
[FIG. 14]
Another schematic plan view showing a structure of a pixel in an active matrix substrate according to Third Embodiment.

The following describes another embodiment (Third Embodiment) of the present invention with reference to FIGS. 11 through 14. FIGS. 11 through 14 are schematic plan views showing a structure of a pixel in an active matrix substrate 100 according to Third Embodiment. FIG. 11 shows a structure of a pixel in which a pixel defect is not corrected. FIGS. 12, 13 and 14 show a structure of a pixel having been subjected to pixel defect correction. In a structure shown in FIGS. 11 through 14, a single TFT includes two source electrodes 6a and 6b, and three drain electrodes 16a, 16b, and 16c. The source electrode 6a corresponds to the two drain electrodes 16a and 16b, and the source electrode 6b corresponds to two drain electrodes 16b and 16c.

As shown in FIGS. 11 through 14, the active matrix substrate 100 includes a plurality of pixel electrodes 1 arranged in matrix, in the vicinity of the pixel electrodes 1, the scanning signal lines 2 for supplying scanning signals and the data signal lines 3 for supplying data signals are provided. The scanning signal lines 2 and the data signal lines 3 intersect with each other. Each of the intersections of the scanning signal lines 2 and the data signal lines 3, a TFT 4 is provided so as to serve as an active element (switching element).

The TFT 4 serving as an active element includes a gate electrode 5 connected to a scanning line 2 and a source electrodes 6a and 6b connected to the data signal line 3, and drain electrodes 16a, 16b and 6c. The drain electrodes 16a, 16b and 16c are connected to the drain outgoing wires 7a, 7b, 7c and 7d (first conductive pattern section) made of a conductive layer constituting a wire section. The drain outgoing wire made up of an outgoing wire common section 7d and the drain outgoing wire branch sections 7a, 7b and 7c which respectively extend into the drain electrodes 16a, 16b and 16c.

The drain outgoing wire common section 7d is connected to the pixel electrode 1 via a contact hole 8 and one of the electrodes (retention capacitor upper electrode) 21 of the retention capacitor element. The retention capacitor wire 22 serves as the other electrode (retention capacitor lower electrode) of the retention capacitor element. The active matrix substrate according to the present embodiment further includes a correction connection electrode 9, which is partly (150 μm²) overlapped with each of the outgoing wire branch sections 7a, 7b and 7c via the insulating layer. The correction connection electrode 9 is connectable to either or both of the branch section 7a, 7b and 7c, penetrating through the insulating layer.

In the structure of FIG. 11, neither of the drain electrodes 16a, 16b nor 16c have defect, and therefore the pixel defect correction is not carried out. Accordingly, in this pixel, the correction connection electrode 9 does not serve as a wire section for connecting the drain electrodes 16a 16b and 16c into the pixel electrode 1.

Note that, the members constituting the cross-section of the active matrix substrate of the present embodiment are the same as those in First Embodiment, and therefore explanation thereof will be omitted here.

FIG. 12 shows a pixel which has been through defect correction to solve a defect (such as leak) in the drain electrode 16a due to the residue film defect 99 between the source electrode 6a and the drain electrode 16a. In this case, the pixel defect was corrected by cutting the portion 97a of the drain outgoing wire branch section 7a. The portion 97a resides between the drain outgoing wire common section 7d and a portion where the drain outgoing wire branch section 7a is overlapped with the correction connection electrode 9.

This pixel defect correction can be carried out by finding out, prior to cutting the branch section, whether the defect exists in the drain electrode 16a, in the drain electrode 16b, or in the drain electrode 16c by the appearance test. Also, in the case where it is already known, by an electric testing or the like, that the defect exists at least one of the drain electrode 16a, the drain electrode 16b, or the drain electrode 16c, one of the branch sections is cut and another electric testing is performed. If the pixel defect is solved by the cutting, the resulting pixel will look like one in FIG. 12. In this case, the drain outgoing wire branch section 7a is cut at the portion 97a which resides between the drain outgoing wire common section 7d and a portion where the drain outgoing wire branch section 7a is overlapped with the correction connection electrode 9. Therefore if the defect part was not found before carrying out cutting of the branch section, and the drain electrode 16a was found not to have the defect, the connection between the branch section 7a and the common 7d can be easily recovered through the correction connection electrode 9. This is described later in detail with reference to FIGS. 13 and 14.

In the pixel of FIG. 12, the drain electrode 16a is blocked from electricity, and the drain electrode 16b and 16c are connected to the outgoing wire common section 7d via the outgoing wire branch sections 7b and 7c, respectively; and the drain outgoing wire common section 7d is connected to the pixel electrode 1 via one of the electrodes (retention capacitor upper electrode) 21 of the retention capacitor element and the contact hole 8. In the pixel of FIG. 12, the correction connection electrode 9 does not serve as a wire for connecting the drain electrodes 16b and 16c to the pixel electrode 1.

FIG. 13 shows a pixel which has been through defect correction to solve a defect (such as leak) in the drain electrode 16b due to the residue film defect 99 between the source electrode 6b and the drain electrode 16b. In this case, the pixel defect was corrected by cutting the portion 97a of the drain outgoing wire branch section 7a and the portion 97b of the drain outgoing wire branch section 7b. The portion 97a resides between the drain outgoing wire common section 7d and a portion where the drain outgoing wire branch section 7a is overlapped with the correction connection electrode 9, and the portion 97b resides between the drain outgoing wire branch section 7b and a portion where the drain outgoing wire branch section 7b is overlapped with the correction connection electrode 9. Then both of the drain outgoing wire branch sections 16a and 16c are electrically connected to the correction connection electrode 9 through the insulating layer at the portion 96a.

This pixel defect correction is performed in the following case. The defective part cannot be found by the appearance test but it is already known, by an electric testing or the like, that the defect exists at least one of the drain electrode 16a, the drain electrode 16b, or the drain electrode 16c; and one of the branch sections is cut. However, according to the subsequent electric testing, the defect was not corrected. In this case, if the pixel defect is cleared away by cutting one of the two uncut branch sections, it can be assumed that the defect does not exist in the drain electrode having been cut first. Therefore, the conduction between the common section and the branch section having been cut first is recovered through the correction connection electrode. In the pixel of FIG. 13, the pixel defect was not solved even after cutting the branch section 7a at the portion 97a. Then, the branch section 7b was cut at the portion 97b, which solved the pixel defect. Then, the connection between the branch section 7a and the branch section 7c are recovered through the correction connection electrode 9.

In the pixel of FIG. 13, the drain electrode 16b is blocked from electricity, and the drain electrode 16a is connected to the drain outgoing wire common section 7d via the drain outgoing wire branch section 7a, the correction connection electrode 9 and the drain outgoing wire branch section 7c, through the alternative path 95. Further, the drain electrode 16c is connected to the drain outgoing wire section 7d via the drain outgoing wire branch section 7c. Then, the drain outgoing wire common section 7d is connected to the pixel electrode 1 via the contact hole 8 and one of the electrodes (retention capacitor upper electrode) 21 of the retention capacitor element.

FIG. 14 shows a pixel which has been through defect correction to solve a defect (such as leak) in the drain electrode 16c due to the residue film defect 99 between the source electrode 6b and the drain electrode 16c. In this case, the pixel defect was corrected by cutting the portion 97a of the drain outgoing wire branch section 7a, the portion 97b of the drain outgoing wire branch section 7b, and the portion 97c of the drain outgoing wire branch section 7c. The portion 97a resides between the drain outgoing wire common section 7d and a portion where the drain outgoing wire branch section 7a is overlapped with the correction connection electrode 9, the portion 97b resides between the drain outgoing wire branch section 7d and a portion where the drain outgoing wire branch section 7b is overlapped with the correction connection electrode 9, and the portion 97c resides between the drain electrode 16c and a portion where the drain outgoing wire branch section 7c is overlapped with the correction connection electrode 9. Then all of the drain outgoing wire branch sections 16a, 16b and 16c are electrically connected to the correction connection electrode 9 through the insulating layer at the portion 96a.

This pixel defect correction is performed in the following case. The defective part cannot be found by the appearance test but it is already known, by an electric testing or the like, that the defect exists at least one of the drain electrode 16a, the drain electrode 16b, or the drain electrode 16c; and two of the branch sections is cut. However, according to the subsequent electric testing, the defect was not corrected. In this case, if the pixel defect is not cleared away even after cutting one of the two uncut branch sections, it can be assumed that the defect does not exist in the two drain electrodes corresponding to the branch sections having been cut. Therefore, the conduction between the common section and the two branch sections having been cut first are recovered through the correction connection electrode. Then the remaining branch section is cut. In the pixel of FIG. 14, the pixel defect was not solved even after cutting the branch sections 7a at the portion 97a and subsequently cutting 7b at the portion 97b. Then, the connection between the branch sections 7a, 7b and 7c are recovered through the correction connection electrode 9. The branch sections 7c is cut at the portion 97c.

In the pixel of FIG. 14, the drain electrode 16c is blocked from electricity, and the drain electrode 16a is connected to the drain outgoing wire common section 7d via the drain outgoing wire branch section 7a, the correction connection electrode 9 and the drain outgoing wire branch section 7c, through the alternative path 95. Similarly, the drain electrode 16b is connected to the drain outgoing wire common section 7d via the drain outgoing wire branch section 7b, the correction connection electrode 9 and the drain outgoing wire branch section 7c, through the alternative path 95. Then, the drain outgoing wire common section 7d is connected to the pixel electrode 1 via the contact hole 8 and one of the electrodes (retention capacitor upper electrode) 21 of the retention capacitor element.

In the present embodiment, the drain outgoing wire branch section is divided by breaking the cut-off sections 97a, 97b and 97c with laser beam irradiation. The laser beam is emitted to the cut-off sections 97a, 97b and 97c through either the front or rear surface of the substrate. Examples of suitable laser beam wavelength include the forth harmonic wave (wavelength=266 nm) of YAG laser. Further, to conduct the drain outgoing wire branch section and the correction connection, the conduction portion 96a is irradiated with a laser beam through either the front or rear surface of the substrate. Examples of suitable laser beam wavelength include the second harmonic wave (wavelength=532 nm) of YAG laser.

Note that, in the present embodiment, the pattern shape of the correction connection electrode 9 is rectangular (quadrangle) as shown in FIGS. 11 through 14. However, the pattern shape of the correction connection electrode 9 is not limited to this, and may be a triangle, a hemicycle or a trapezoid. More specifically, it is preferable that a part of the correction connection electrode 9 be so formed as to overlap the patterns of the drain outgoing wire branch section 7a, 7b and 7c via a gate insulating film, and ensure a portion to be subjected to laser irradiation. For example, an alternative path such as 95 in FIGS. 13 and 14 is preferably provided. Further, the location of the portion where the correction connection electrode and the drain outgoing wire branch section are overlapped is not particularly limited.

The pixel defect correction according to the present embodiment is basically performed after at least a pixel electrode is formed. However, in applying this method to a liquid crystal display apparatus, it is more preferable to carry out the correction after the liquid crystal layer is formed so as to confirm lighting of panel. In this way, the channel causing leak can be securely removed electrically, and an alternative path can be provided. However, the timing of correction is not strictly limited to this, and the present embodiment also includes a correction carried out after the channel etching, which is performed after the drain outgoing wires 7a, 7b, 7c and 7d are formed. Though the present embodiment uses a TFT containing three drain electrodes, the present invention is not limited to this structure. The pixel defect correction according to the present invention may be performed in the same manner for a TFT containing 4 or more drain electrodes.

FORTH EMBODIMENT

Figure 15:
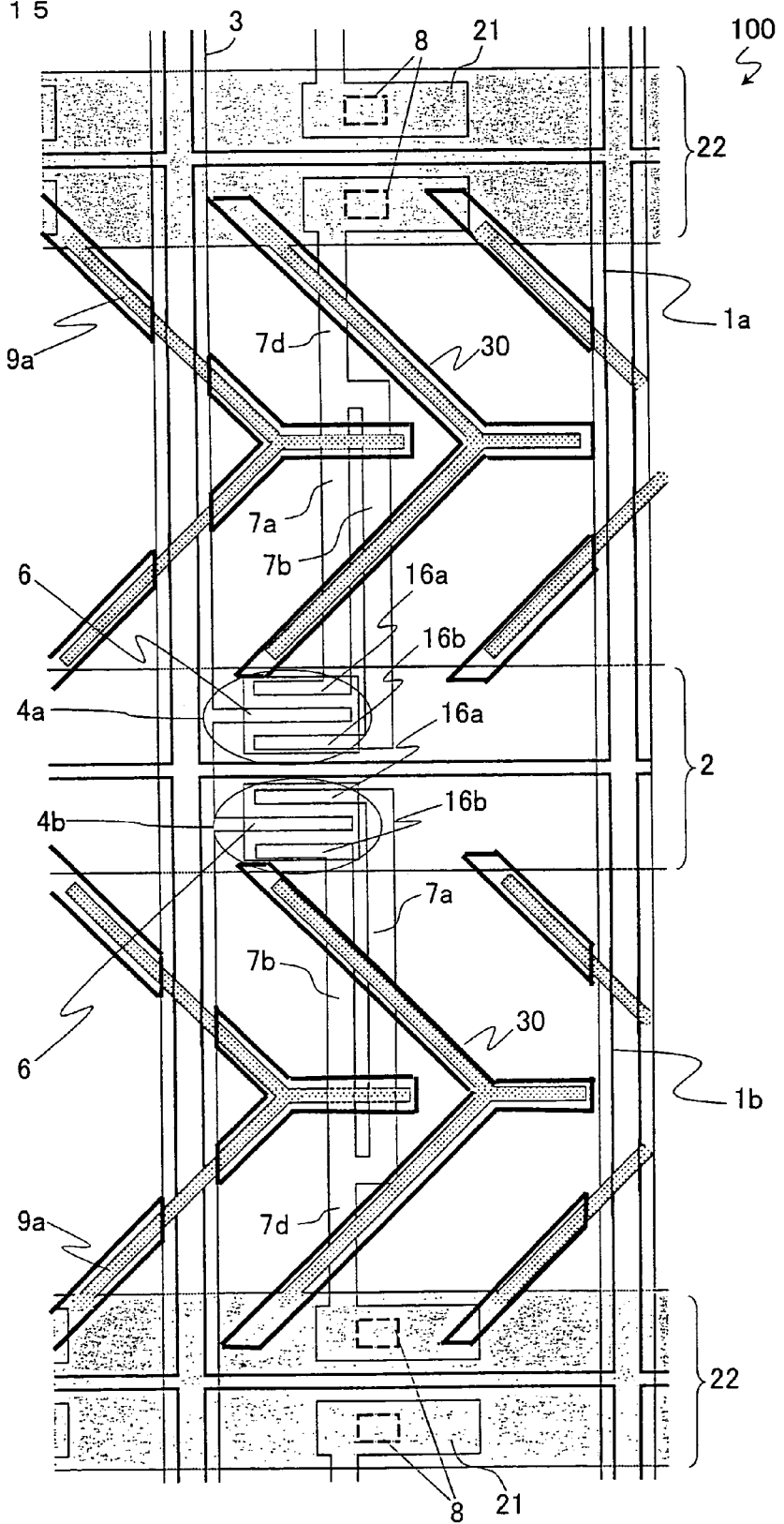
[FIG. 15]
A schematic plan view showing a structure of a pixel in an active matrix substrate according to Fourth Embodiment.
Figure 16:
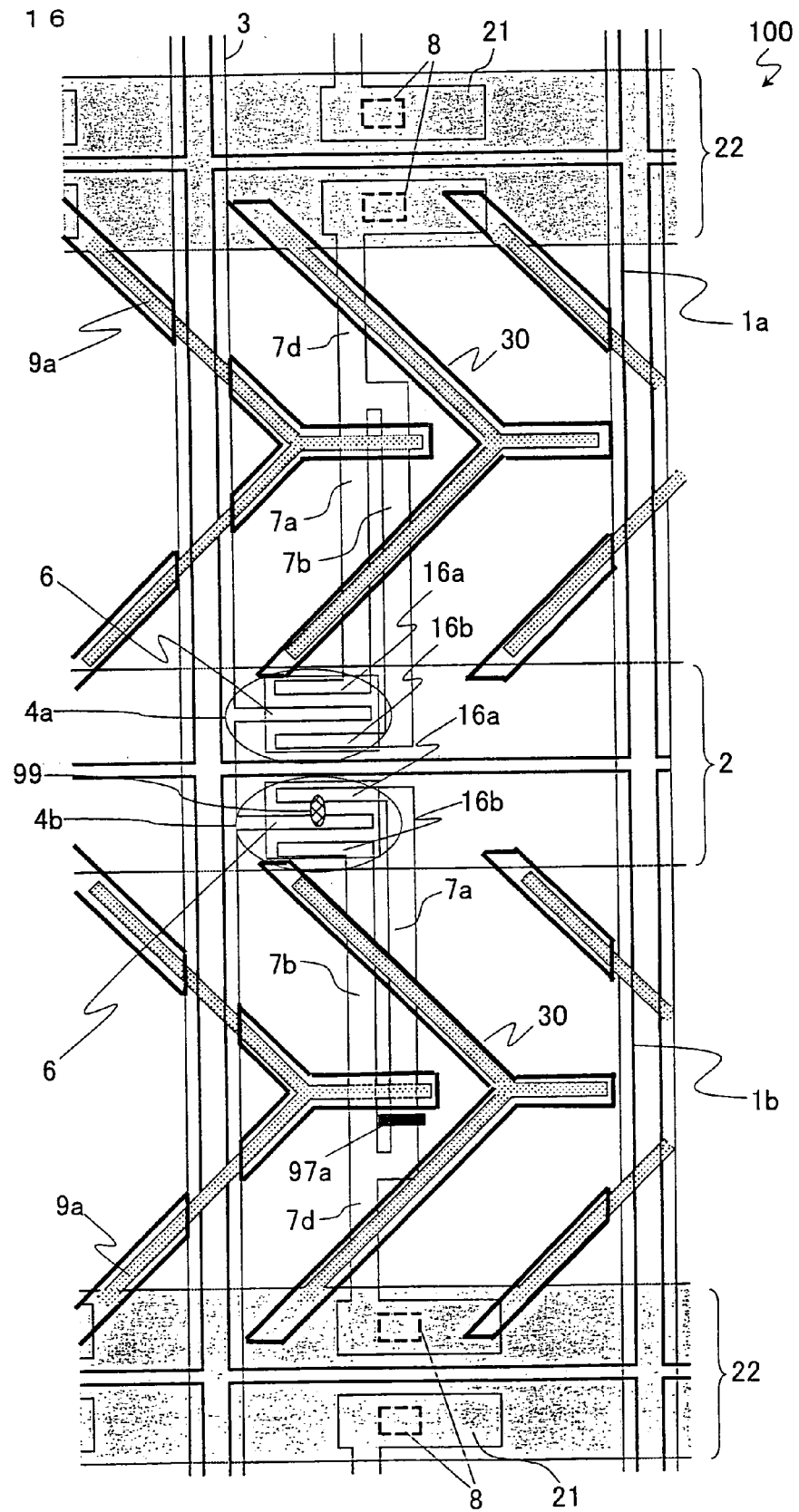
[FIG. 16]
Another schematic plan view showing a structure of a pixel in an active matrix substrate according to Fourth Embodiment.
Figure 17:
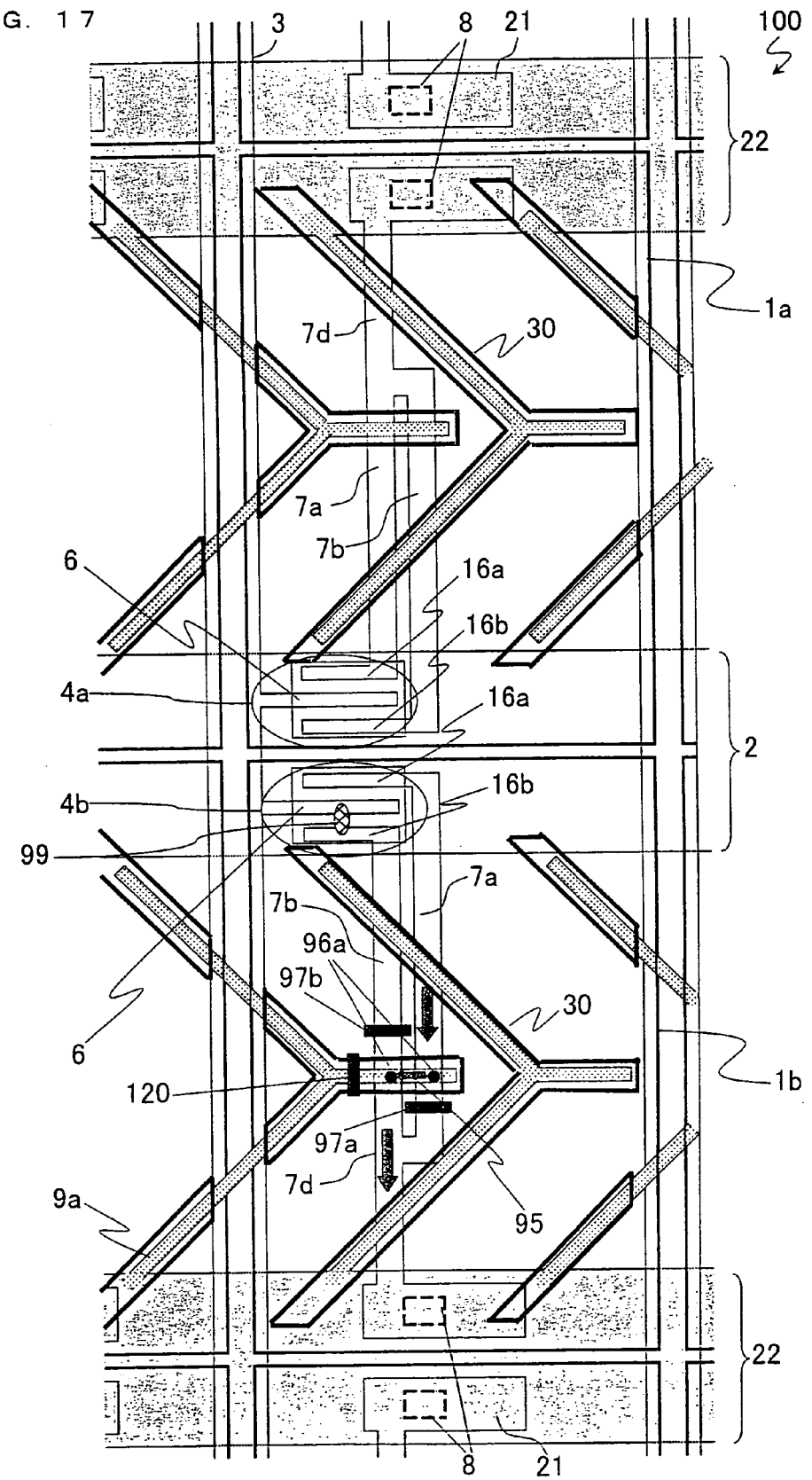
[FIG. 17]
Another schematic plan view showing a structure of a pixel in an active matrix substrate according to Fourth Embodiment.
Figure 18:
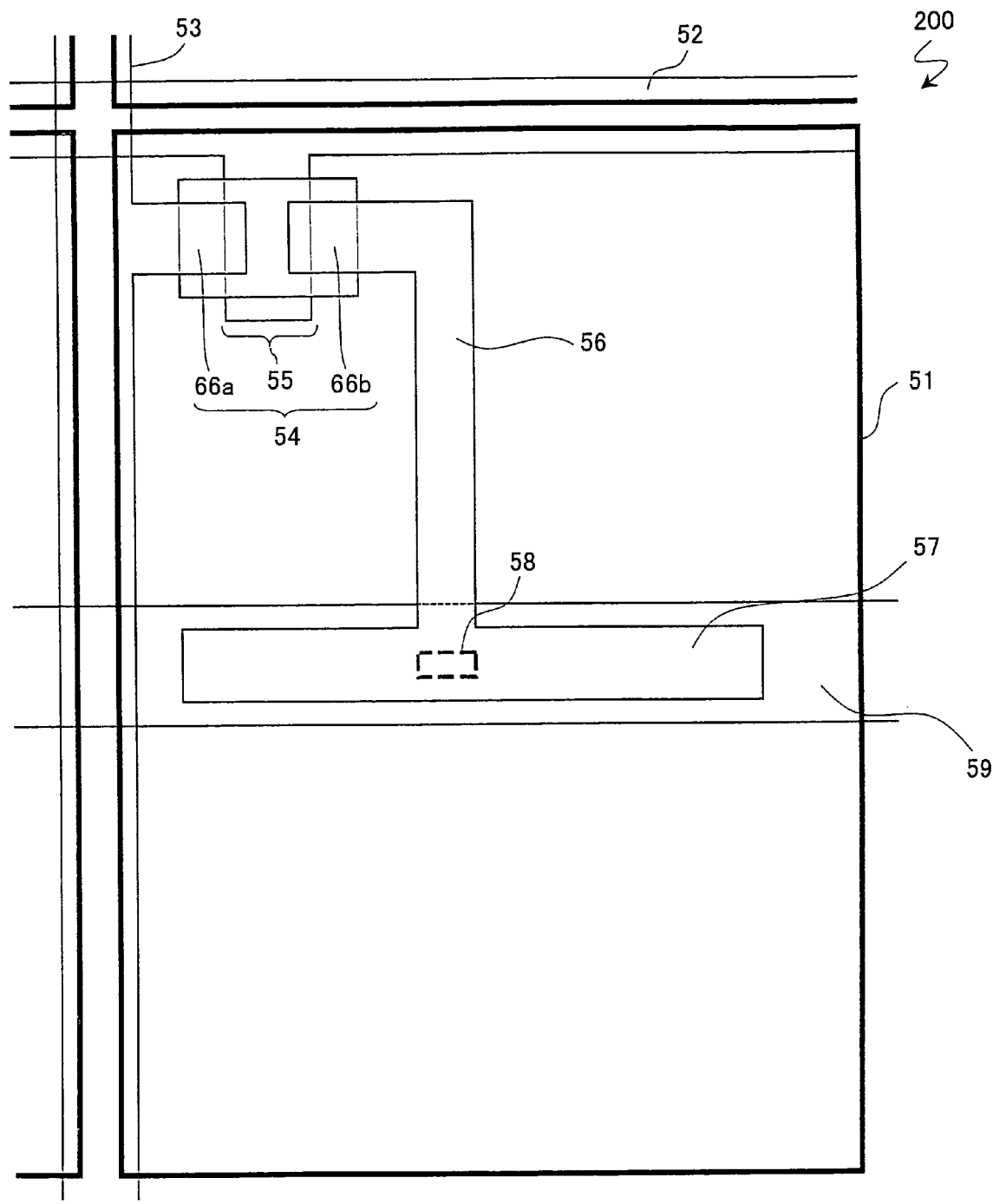
[FIG. 18]
A schematic plan view showing a structure of a pixel in a conventional active matrix substrate.

The following describes another embodiment (Forth Embodiment) of the present invention with reference to FIGS. 15 through 17. FIG. 15 shows a schematic plan view showing a structure of a pixel in an active matrix substrate 100 according to Fourth Embodiment. FIG. 15 shows a structure of a pixel in which a pixel defect is not corrected. FIGS. 16 and 17 show a structure of a pixel having been subjected to pixel defect correction.

As shown in FIGS. 15 through 17, in the active matrix substrate according to the present embodiment, the pixel is broken into a plurality of pixels, and sub-pixel electrode 1a and 1b are respectively connected to separate TFT 4a and 4b. As such, the active matrix substrate of the present invention has so-called a multi pixel structure. The active matrix substrate 100 includes a plurality of sub-pixel electrodes 1a and 1b arranged in matrix, in the vicinity of the sub-pixel electrodes 1a and 1b, the scanning signal lines 2 for supplying scanning signals and the data signal lines 3 for supplying data signals are provided. The scanning signal lines 2 and the data signal lines 3 intersect with each other. Each of the intersections of the scanning signal lines 2 and the data signal lines 3, TFT 4a and 4b are provided so as to serve as a switching element. These TFT 4a and 4b each have an on GATE (TFT on gate) structure, and the scanning signal line 2 serves also as a gate electrode. This arrangement gives an effect of increase of aperture ratio.

The TFT 4a and 4b serving as active elements each include a gate electrode and a source electrode 6 connected to the data signal line 3, and drain electrodes 16a and 16b. The drain electrodes 16a and 16b are connected to the drain outgoing wires 7a, 7b and 7d (first conductive pattern section) made of a conductive layer constituting a wire section. The drain outgoing wire made up of an outgoing wire common section 7d and the drain outgoing wire branch sections 7a and 7b which respectively extend into the drain electrodes 16a and 16b. The drain outgoing wire common section 7d is connected to the sub-pixel electrodes 1a and 1b via a contact hole 8 and one of the electrodes (retention capacitor upper electrode) 21 of the retention capacitor element. The retention capacitor wire 22 serves as the other electrode (retention capacitor lower electrode) of the retention capacitor element. The active matrix substrate according to the present embodiment further includes an electrode 9a, which is partly (150 μm²) overlapped with each of the outgoing wire branch sections 7a and 7b via the insulating layer. The electrode 9a is connectable to either or both of the branch section 7a and 7b, penetrating through the insulating layer.

Further, in the present embodiment, the electrode 9a connected to the retention capacitor wire 22 is so provided as to overlap with the (sub-)pixel electrode slit 30 of the active matrix substrate.

The pixel electrode slit 30 of the active matrix substrate is an electrode pattern for controlling division/alignment of liquid crystal. The pixel electrode slit 30 is formed on a substrate in a vertical alignment-type liquid crystal display apparatus of MVA mode, typically used for a large-sized liquid crystal TV.

In the present embodiment, the electrode 9a (an extension part of the retention capacitor wire 22, and may serve as a correction connection electrode) different in potential from the pixel electrode is provided under pixel electrode slit 30. With this arrangement, the fringe field effect in the pixel electrode slit 30 appears more effectively, and the alignment control effect of liquid crystal increases. Note that, a part of the electrode 9a may be electrically separated from at least one of the retention capacitor wires 22 in the same conductive layer to be serve as a correction connection electrode.

Further, since the electrode 9a is formed under the pixel electrode slit 30 which does not affect the aperture ratio, it is possible to maintain the aperture ratio.

Note that, the members constituting the cross-section of the active matrix substrate of the present embodiment are the same as those in First Embodiment, and therefore explanation thereof will be omitted here.

Further, in the present embodiment, the electrode 9a extended from the retention capacitor wire 22 is provided to overlap with the (sub-)pixel electrode slit 30 of the active matrix substrate.

The pixel electrode slit 30 of the active matrix substrate is an electrode pattern for controlling division/alignment of liquid crystal. The pixel electrode slit 30 is formed on a substrate in a vertical alignment-type liquid crystal display apparatus of MVA mode, typically used for a large-sized liquid crystal TV.

Note that, the pattern shape of the electrode 9a is not limited to those shown in FIGS. 15 through 17. The shape of the electrode 9a is adjustable according to the shape of the pixel electrode slit 30 and the pattern of the capacitor wire 22.

Further, it is not necessary to place all of the electrode pattern 9a. For example, it is possible to provide the wires or the like for connecting the respective electrodes corresponding to the plural pixel electrode slits 30 somewhere other than the pixel electrode slit 30.

Further, in the present embodiment, the electrode (an extension part of the retention capacitor wire) is overlapped with the slit electrode pattern for controlling division/alignment of liquid crystal formed on a substrate in a vertical alignment type liquid crystal display apparatus of MVA mode. However, the present invention is not limited to this case. For example, the electrode may be overlapped with a projection for controlling division/alignment of liquid crystal formed on a substrate. This layout also has the effect of ensuring the aperture ratio.

The operation of the TFT 4a and 4b are controlled by scanning signals supplied to the gate electrode 5, and the sub-pixel electrodes 1a and 1b are supplied with intended levels of voltage as data signals are supplied to the source electrode 6 of the TFT 4a and 4b. Further, the retention capacitor wires 22 which individually serve as the retention capacitor lower electrodes for the respective sub-pixels are supplied with plural signals with different phases (pixel division method). The signals supplied to these retention capacitor lower electrodes vary the respective luminances of the plural sub-pixels constituting a pixel. This gives an effect of increase of the viewing angle characteristic (i.e., it suppresses excess brightness in the oblique viewing angle).

In the structure of FIG. 15, neither of the drain electrode 16a nor the drain electrode 16b have defect, and therefore the pixel defect correction is not carried out. Accordingly, in this pixel, the correction connection electrode 9a does not serve as a wire section for connecting the drain electrodes 16a and 16b into the pixel electrode 1. Further, since the electrode 9a is not required to function as a wire section, the part of the electrode 9a which can be used as a correction connection electrode is not electrically separated from the retention capacitor wire 22.

FIG. 16 shows a pixel of the TFT 4b connected to the sub-pixel 1b. This pixel has been through defect correction to solve a defect (such as leak) in the drain electrode 16a due to the residue film defect 99 between the source electrode 6 and the drain electrode 16a. In this case, the pixel defect was corrected by cutting the portion 97a of the drain outgoing wire branch section 7a. The portion 97a resides between the drain outgoing wire common section 7d and a portion where the drain outgoing wire branch section 7a is overlapped with the electrode 9a.

This pixel defect correction can be carried out by finding out, prior to cutting the branch section, whether the defect exists in the drain electrode 16a or in the drain electrode 16b by the appearance test. Also, in the case where it is already known, by an electric testing or the like, that the defect exists at least either of the drain electrode 16a or the drain electrode 16b, one of the branch sections is cut and another electric testing is performed. If the pixel defect is solved by the cutting, the resulting pixel will look like one in FIG. 16. In this case, the drain outgoing wire branch section 7a is cut at the portion 97a which resides between the drain outgoing wire common section 7d and a portion where the drain outgoing wire branch section 7a is overlapped with the correction connection electrode 9a. Therefore if the defect part was not found before carrying out cutting of the branch section, and the drain electrode 16a was found not to have the defect, the connection between the branch section 7a and the common 7d can be easily recovered through a part of the correction connection electrode 9a. This is described later in detail with reference to FIG. 17.

In the sub-pixel 1b of FIG. 16, the drain electrode 16a is blocked from electricity, and the drain electrode 16b is connected to the outgoing wire common section 7d via the outgoing wire branch section 7b, and the drain outgoing wire common section 7d is connected to the pixel electrode 1 via the contact hole 8. Note that, in this sub-pixel 1b, the electrode 9 does not serve as a wire section for connecting the drain electrode 16b into the sub-pixel electrode 1b. Further, since the electrode 9a is not required to function as a wire section, the part of the electrode 9a which can be used as a correction connection electrode is not electrically separated from the retention capacitor wire 22.

FIG. 17 shows a pixel of the TFT 4b connected to the sub-pixel 1b. This pixel has been through defect correction to solve a defect (such as leak) in the drain electrode 16b due to the residue film defect 99 between the source electrode 6 and the drain electrode 16b. In this case, the pixel defect was corrected by cutting the portion 97a of the drain outgoing wire branch section 7a and the portion 97b of the drain outgoing wire branch section 7b. The portion 97a resides between the drain outgoing wire common section 7d and a portion where the drain outgoing wire branch section 7a is overlapped with the correction connection electrode 9a, and the portion 97b resides between the drain electrode 16b and a portion where the drain outgoing wire branch section 7b is overlapped with the correction connection electrode 9a. Further, a part of the electrode 9a is separated from the retention capacitor wire 22 by cutting the portion 120. Then both of the drain outgoing wire branch sections 16a and 16b are electrically connected to the correction connection electrode 9a through the insulating layer at the portion 96a.

This pixel defect correction is performed in the following case. The defective part cannot be found by the appearance test but it is already known, by an electric testing or the like, that the defect exists at least either of the drain electrode 16a or the drain electrode 16b, and one of the branch sections is cut. However, according to the subsequent electric testing, the defect was not corrected. In this case, it can be assumed that the defect does not exist in the drain electrode having been cut. Therefore, the conduction between the common section and the branch section having been cut is recovered through the correction connection electrode. Then the other branch section is cut.

In the sub-pixel 1b of FIG. 17, the drain electrode 16b is blocked from electricity, and the drain electrode 16a is connected to the drain outgoing wire common section via the drain outgoing wire branch section 7a, the correction connection electrode 9a and the drain outgoing wire branch section 7b, through the alternative path 95. Then, the drain outgoing wire common section 7d is connected to the sub-pixel electrode 1b via the contact hole 8 and one of the electrodes (retention capacitor upper electrode) 21 of the retention capacitor element.

In the present embodiment, the drain outgoing wire branch section is divided by breaking the cut-off sections 97a, 97b and 120 with laser beam irradiation. The laser beam is emitted to the cut-off section 97a, 97b and 120 through either the front or rear surface of the substrate. Examples of suitable laser beam wavelength include the forth harmonic wave (wavelength=266 nm) of YAG laser. Further, to conduct the drain outgoing wire branch section and the correction connection electrode, the conduction portion 96a is irradiated with a laser beam through either the front or rear surface of the substrate. Examples of suitable laser beam wavelength include the second harmonic wave (wavelength=532 nm) of YAG laser.

Note that, the described invention which enables pixel correction within the defective pixel has an effect of suppressing deterioration of the function of a sub-pixel with a different luminance. Therefore, the invention ensures superior viewing angle characteristic of multi pixel driving.

The present embodiment describes a case where the sub-pixel 1b has the pixel defect. However, the invention may also be useful to correct defects in the sub-pixel 1a.

Further, though the present embodiment describes a case of multi-pixel structure in which a single pixel is constituted of two sub-pixels, the case where the pixel is constituted of three or more pixels falls also within the scope of the invention.

The present embodiment describes a case of multi-pixel structure of MVA mode, but the scope of invention also includes a MVA mode not using multi-pixel structure, or a multi-pixel structure of a mode other than MVA.

Note that, the described invention is not limitedly used for a liquid crystal display apparatus, and may be adopted for other types of display apparatuses. For example, it may be used for an organic EL display with the following manner. The active matrix substrate according to the present invention is placed opposite to a color filter substrate, and an organic EL layer is provided between the two substrates to form an organic EL panel, which is completed as an organic EL display apparatus by connecting into a driver or the like via an external connection terminal. More specifically, the present invention is applicable to any kinds of display apparatus other than a liquid crystal display apparatus or an organic EL display apparatus, as long as the display apparatus uses an active matrix substrate.

FIFTH EMBODIMENT

The following describes another embodiment (Fifth Embodiment) of the present invention with reference to FIGS. 19 through 24. For ease of explanation, materials having the equivalent functions as those shown in the drawings pertaining to the foregoing First to Fifth Embodiments will be given the same reference symbols, and explanation thereof will be omitted here.

The active matrix substrate according to the present embodiment is the same as those described in Second and Third embodiments with reference to FIGS. 8 and 11, except that in the present embodiment the TFT (active element) 4 includes a plurality of correction connection electrodes 9.

Figure 19:
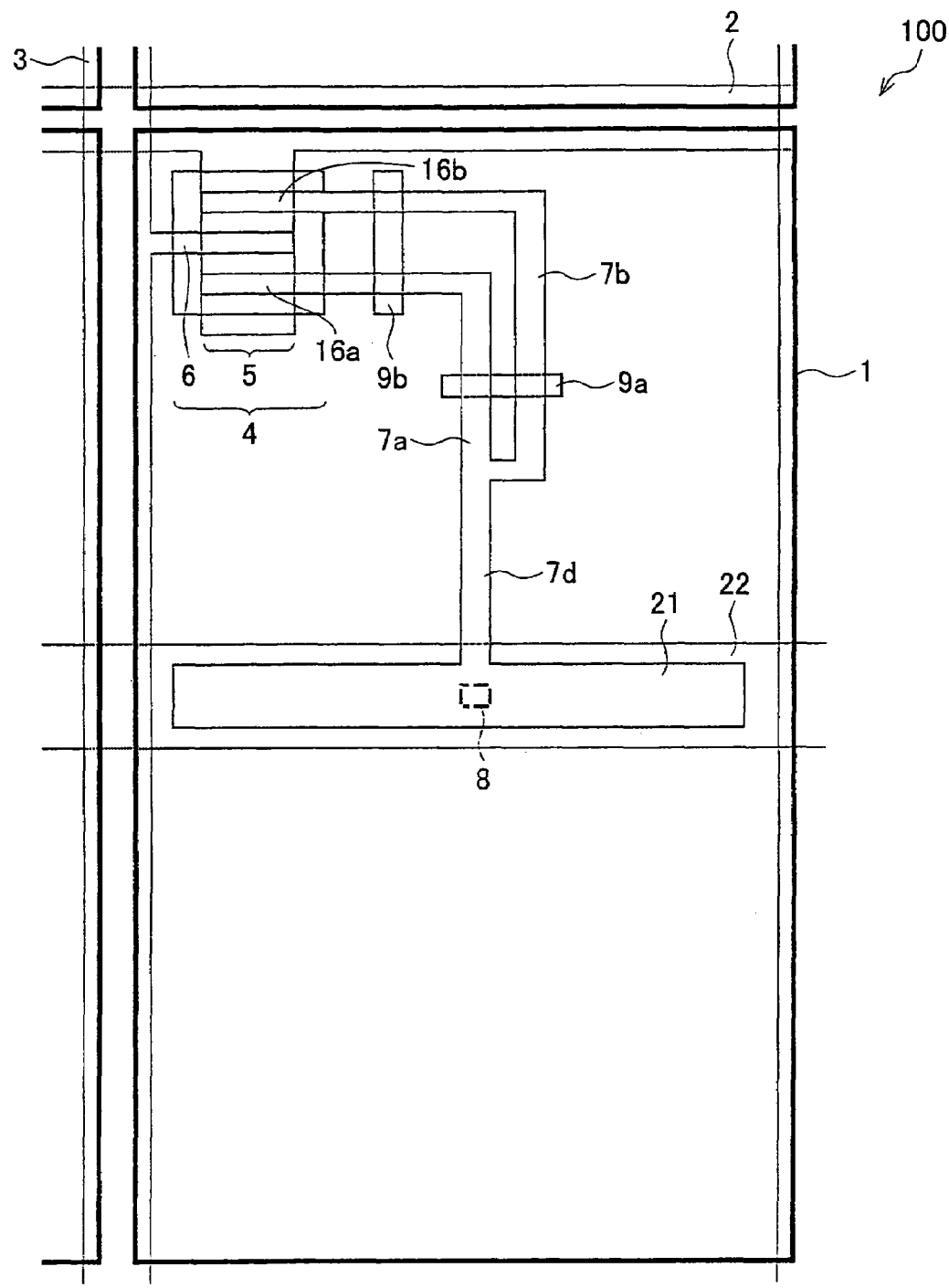
[FIG. 19]
A schematic plan view showing a structure of a pixel in an active matrix substrate according to Fifth Embodiment.

As shown in FIG. 19, the active matrix substrate 100 includes the same drain electrodes 16a and 16b as those shown in FIG. 8 of Second Embodiment. As with Second Embodiment, the drain electrodes 16a and 16b are connected to the drain outgoing wire branch section 7a and 7b, and the drain outgoing wire common section 7d is connected to the pixel electrode 1 via the contact hole 8. The active matrix substrate 100 shown in FIG. 8 includes a single correction connection electrode 9 which serves as the second conductive pattern section and is provided in the vicinity of the drain outgoing wire common section 7d across the drain outgoing wire branch sections 7a and 7b. In contrast, the active matrix substrate 100 of FIG. 19 includes two correction connection electrodes 9a and 9b, near the drain outgoing wire common section 7d and near the TFT 4, respectively. The two correction connection electrodes 9a and 9b are provided across the drain outgoing wire branch section 7a and 7b.

Figure 20:
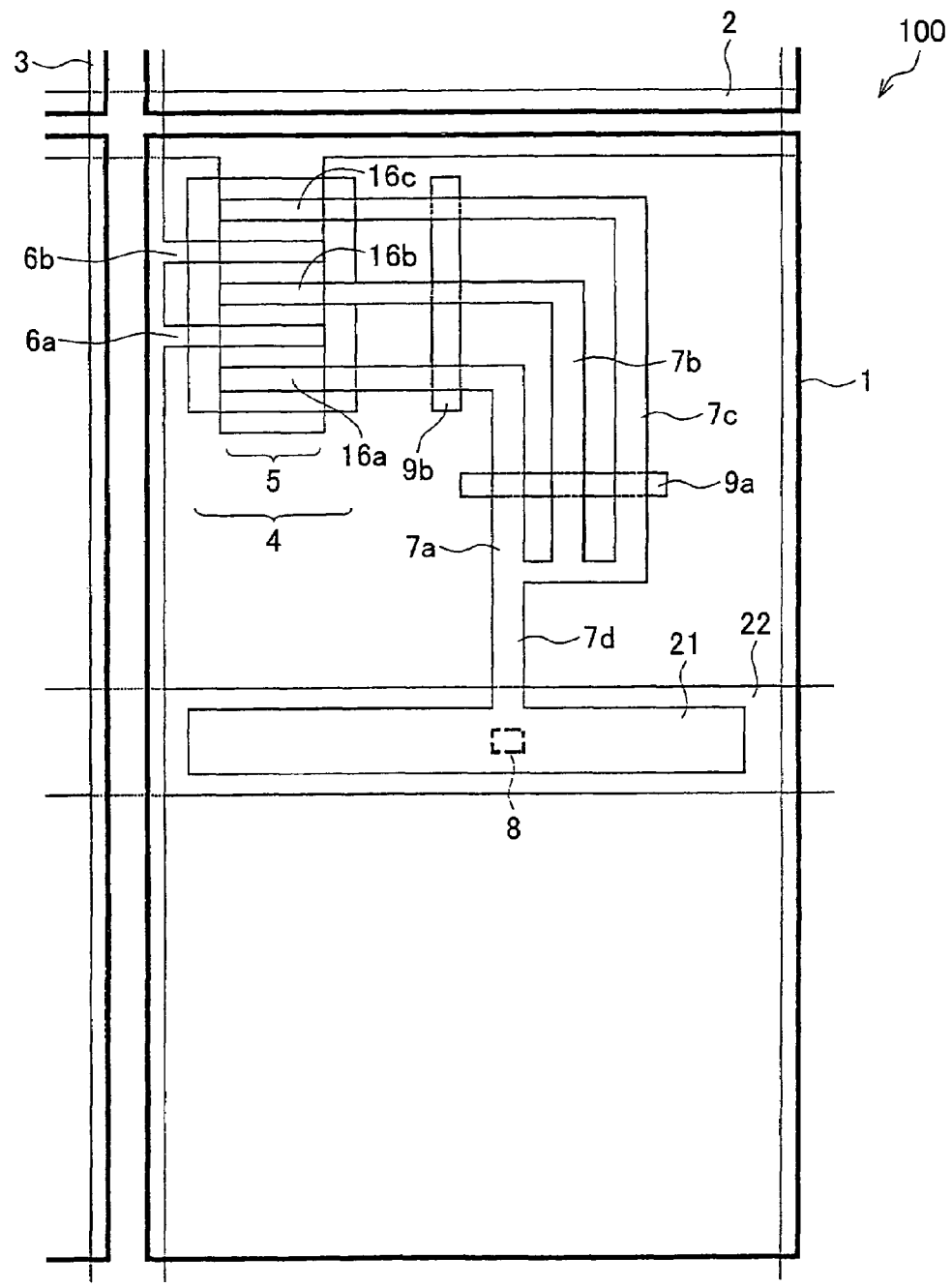
[FIG. 20]
A schematic plan view showing a structure of a pixel in another active matrix substrate according to Fifth Embodiment.

Further, the active matrix substrate 100 shown in FIG. 20 corresponds to the active matrix substrate 100 of FIG. 11 according to Third Embodiment in which the drain electrodes 16a, 16b and 16c are connected to the drain outgoing wire branch sections 7a, 7b and 7c; and the drain outgoing wire common section 7d is connected to the pixel electrode 1 via the contact hole 8. The active matrix substrate 100 shown in FIG. 11 includes a single correction connection electrode 9 which serves as the second conductive pattern section and is provided in the vicinity of the drain outgoing wire common section 7d across the drain outgoing wire branch sections 7a, 7b and 7c. In contrast, the active matrix substrate 100 of FIG. 20 includes two correction connection electrodes 9a and 9b, near the drain outgoing wire common section 7d and near the TFT 4, respectively. The two correction connection electrodes 9a and 9b are provided across the drain outgoing wire branch section 7a, 7b and 7c.

This structure in which a plurality of correction connection electrodes 9 are provided for a single TFT 4 has an effect of increasing security of pixel defect correction.

Figure 21:
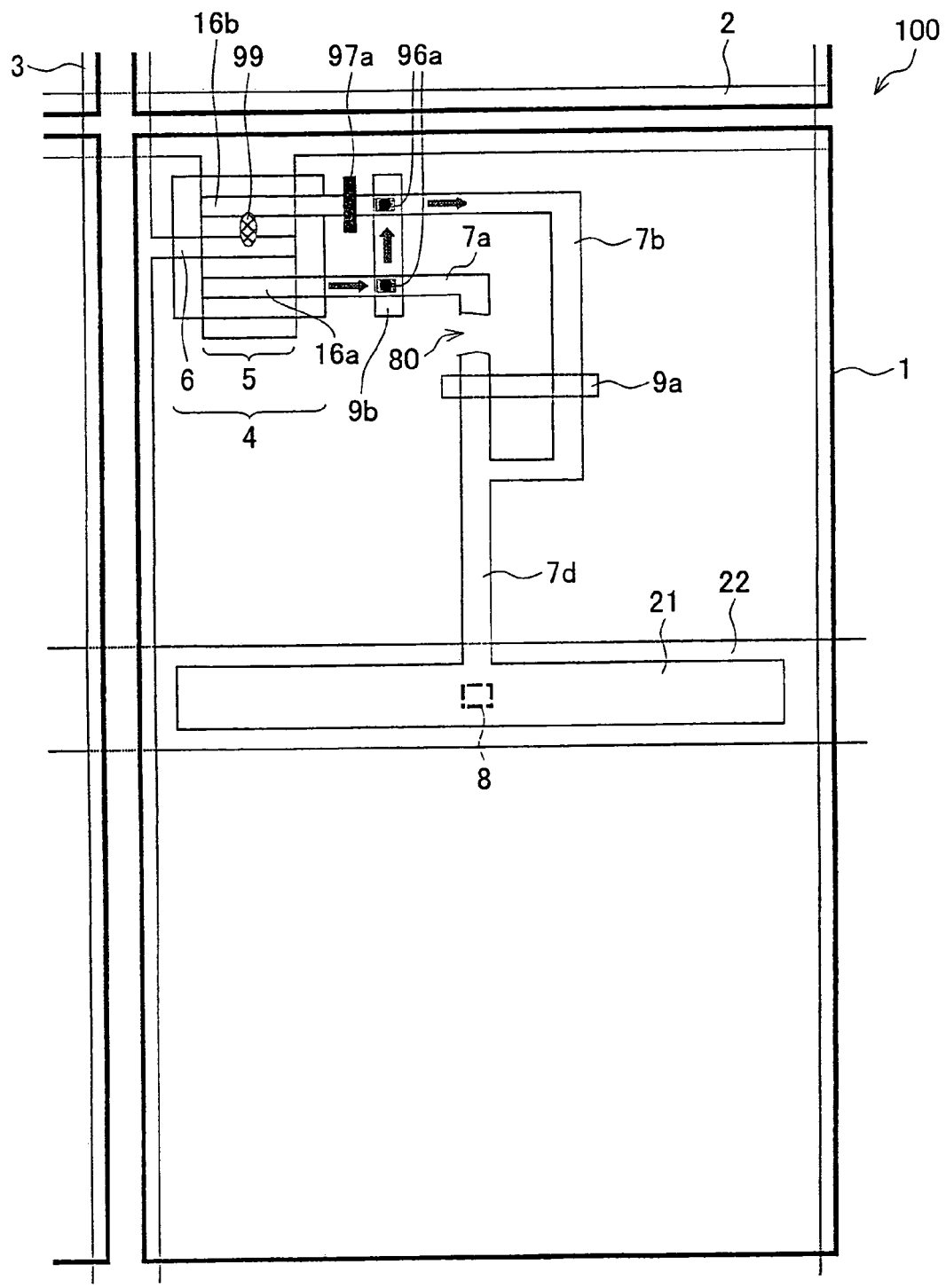
[FIG. 21]
A schematic plan view of a pixel in an active matrix substrate shown in FIG. 19. The view shows an example of pixel modification.
Figure 22:
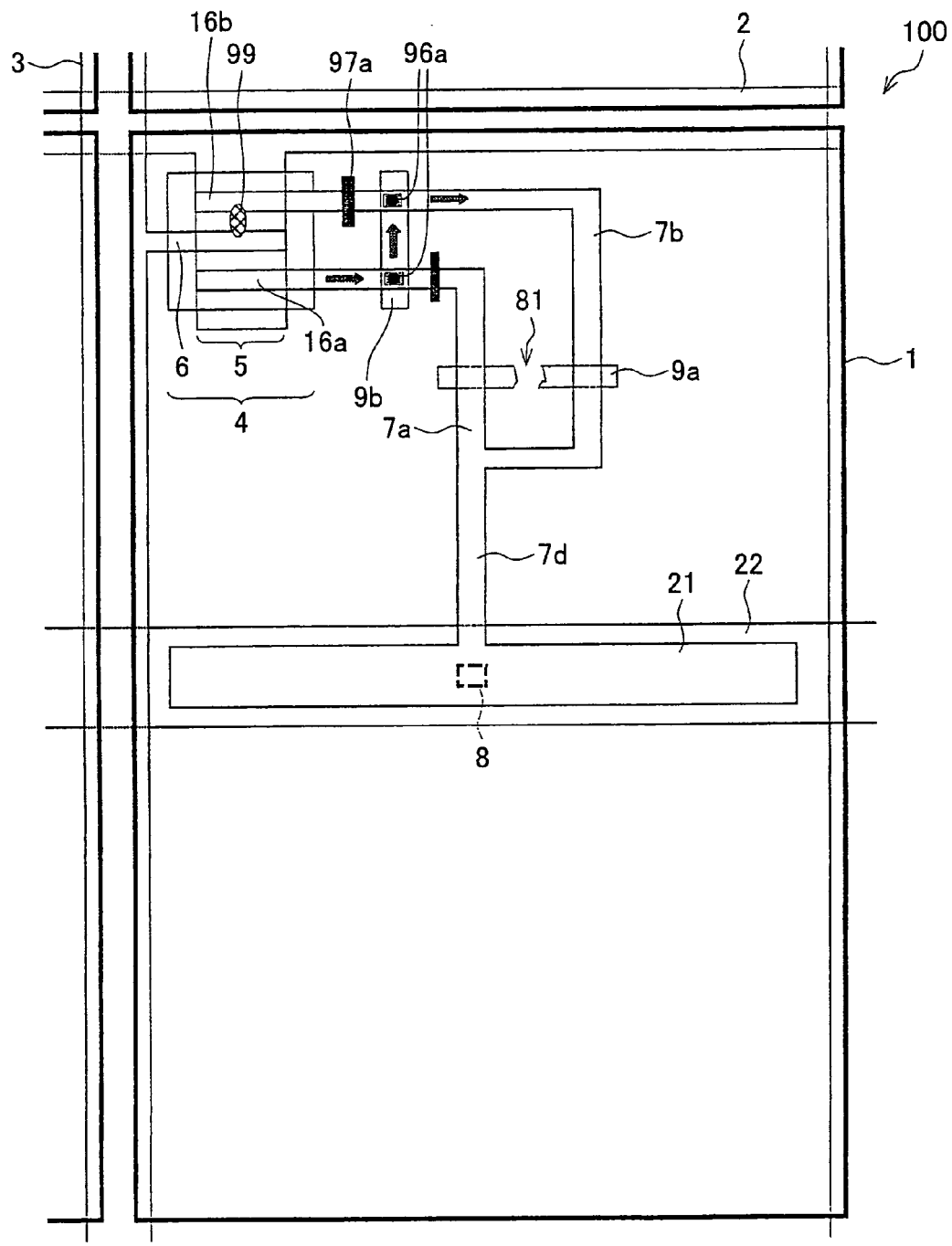
[FIG. 22]
A schematic plan view of a pixel in an active matrix substrate shown in FIG. 19. The view shows another example of pixel modification.

For example, in the case of active matrix substrate 100 shown in FIG. 8 using a single correction connection electrode 9, the pixel correct defection cannot be performed if the drain outgoing wire branch section 7a (or 7b) is cut off as shown by the numeral 80 of FIG. 21, or if the correction connection electrode 9a itself is cut off as shown by the numeral 81 of FIG. 22.

However, with the active matrix substrate 100 shown in FIGS. 19 and 20 in which a plurality of correction connection electrodes 9a and 9b are provided for a single TFT 4, the pixel defect correction can be performed with the correction connection electrode 9b even if the drain outgoing wire branch section 7a (or 7b) is cut off as shown by the numeral 80 of FIG. 21, or if the correction connection electrode 9a is cut off as shown by the numeral 81 of FIG. 22.

Further, in the structure in which the two correction connection electrodes 9a and 9b are provided for a single TFT 4, the gap between the correction connection electrodes 9a and 9b is preferably large. Therefore, as shown in FIGS. 19 and 20, the correction connection electrodes 9a and 9b are preferably provided near the drain outgoing wire common section 7d and near the TFT 4, respectively. If both of the correction connection electrodes 9a and 9b are provided near the TFT 4, the pixel defect cannot be corrected when the drain outgoing wire branch section 7a (or 7b) is cut off as shown by the numeral 80 of FIG. 21.

Further, assurance of pixel defect correction due to line breakage 80 or 81 increases as the number of correction connection electrodes 9 increases. However, a larger number of correction connection electrodes 9 results in a decrease in aperture ratio. Therefore, the number of correction connection electrodes 9 is determined in consideration of aperture ratio and probability of occurrence of line breakage 80/81.

Figure 23:
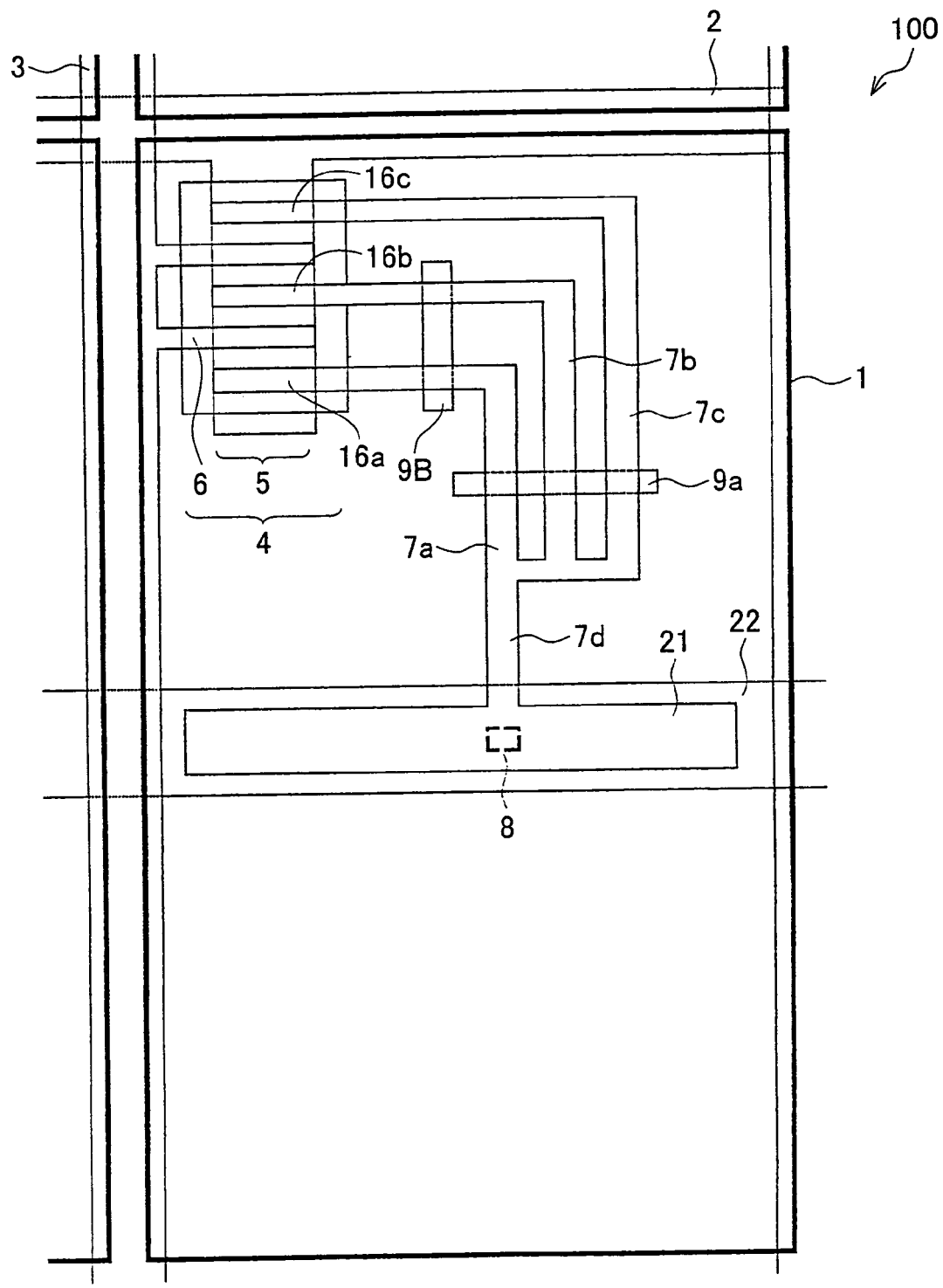
[FIG. 23]
A schematic plan view showing a structure of a pixel in another active matrix substrate according to Fifth Embodiment.
Figure 24:
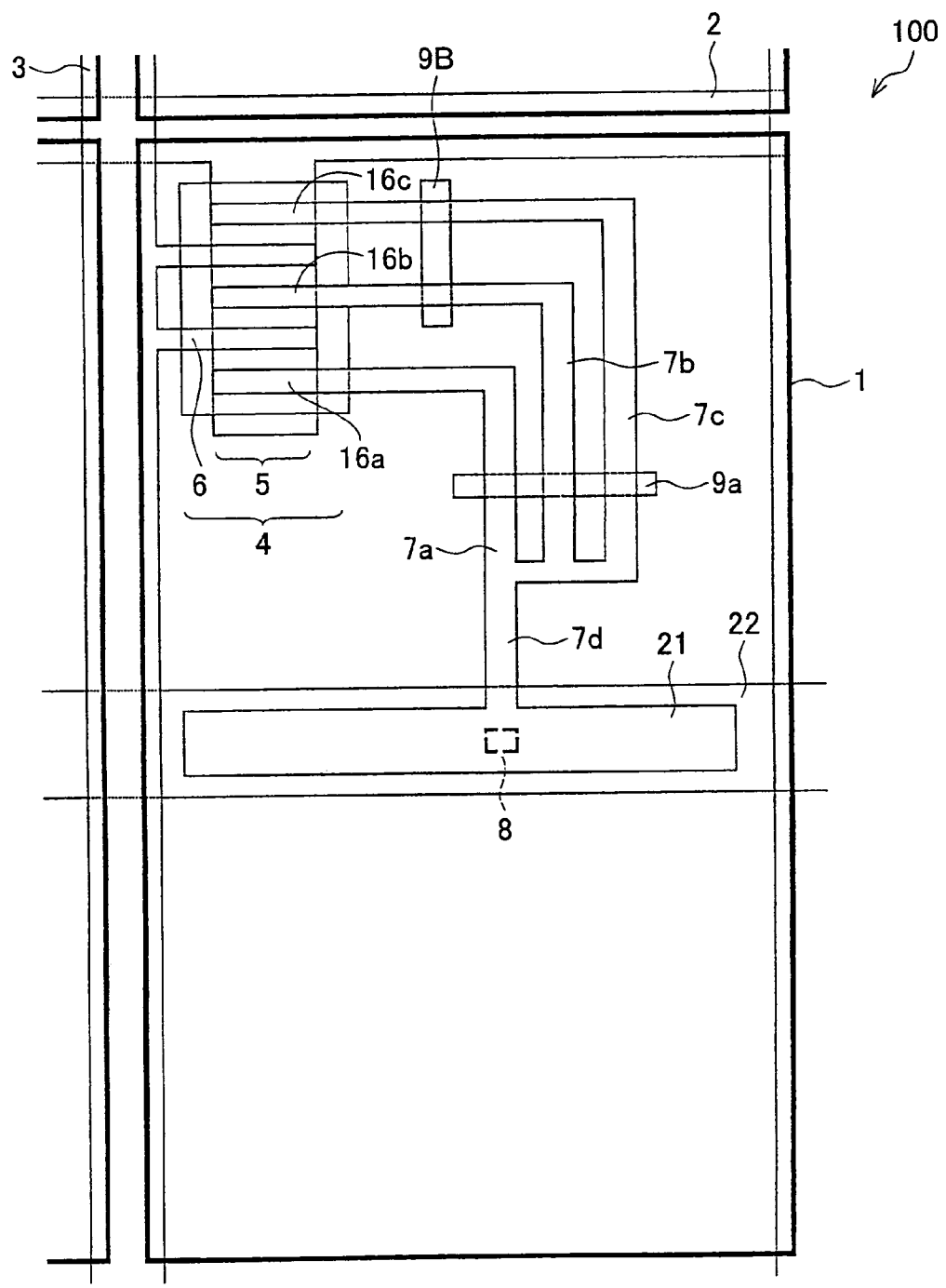
[FIG. 24]
A schematic plan view showing a structure of a pixel in still another active matrix substrate according to Fifth Embodiment.

With reference to FIGS. 23 and 24, the following explains a structure ensuring desirable aperture ratio with a plurality of correction connection electrodes 9 for a single TFT 4.

As with the active matrix substrate 100 of FIG. 20, each of the active matrix substrates 100 shown in FIGS. 23 and 24 includes three drain electrodes 16a 16b and 16c, and two correction connection electrodes 9. In FIG. 20, the active matrix substrate 100 includes two correction connection electrodes 9a and 9b, which are provided across the all of the three drain outgoing wire branch section 7a, 7b and 7c (second conductive pattern A section).

In contrast, in the active matrix substrates 100 in FIGS. 23 and 24, the correction connection electrode 9a, which is one of the two correction connection electrodes, run across all of the drain outgoing wire branch sections 7a, 7b and 7c. However, the other one, the correction connection electrode 9B runs across a part of the three drain outgoing wire branch section, more specifically, it runs across two out of the three drain outgoing wires (second conductive pattern B section).

More specifically, in the active matrix substrate 100 of FIG. 23, the correction connection electrode 9B runs across drain outgoing wire branch sections 7a and 7b. On the other hand, in the active matrix substrate 100 of FIG. 24, the correction connection electrode 9B runs across the drain outgoing wire branch sections 7b and 7c.

In this manner, in the case of using three or more drain outgoing wire branch sections, the correction connection electrode 9B which enables conduction of a part of the plural drain outgoing wire branch sections is provided. This maintains a certain redundant effect, and ensures high aperture ratio.

Further, in this structure including the correction connection electrode 9B which enables conduction of a part of the plural drain outgoing wire branch sections, it is preferable that the correction connection electrode 9B be partly overlapped with the longest drain outgoing wire branch section out of the three drain outgoing wire branch sections, and the longest drain outgoing wire branch section be made conductible to the other drain outgoing wire branch sections.

A longer wire is more likely to break. In the active matrix substrates 100 of FIGS. 23 and 24, the drain outgoing wire branch section 7c is most likely to break. That is, the active matrix substrate 100 of FIG. 24 in which the correction connection electrode 9B runs across the longest drain outgoing wire branch section 7c and the drain outgoing wire branch section 7b more securely ensures pixel defect correction than the active matrix substrate 100 of FIG. 23.

SIXTH EMBODIMENT

The following describes another embodiment (Sixth Embodiment) of the present invention with reference to FIGS. 25 through 29. For ease of explanation, materials having the equivalent functions as those shown in the drawings pertaining to the foregoing First to Sixth Embodiments will be given the same reference symbols, and explanation thereof will be omitted here.

The active matrix substrate 100 of the present embodiment is the same as the active matrix substrate 100 of FIG. 8 of Second Embodiment, except that the pixel electrode 1 includes a removal section 83 which is a portion where ITO, which is the material of pixel electrode, is removed. The removal section 83 is partly overlapped with the drain outgoing wire branch sections 7a and 7b.

In the pixel defect correction which performs separating (cutting) of the drain outgoing wire branch section 7a (or 7b) from the drain electrode 16a (or 16b), and conduction of the separated drain outgoing wire branch section 7a (or 7b) into the drain outgoing wire branch section 7b (or 7a) via the correction connection electrode 9. At this time, a leak tends to occur between the pixel electrode 1 thereon and the drain outgoing wire branch section 7a (or 7b) connected to the channel with a leak (SD leak) between source/drain.

Figure 25:
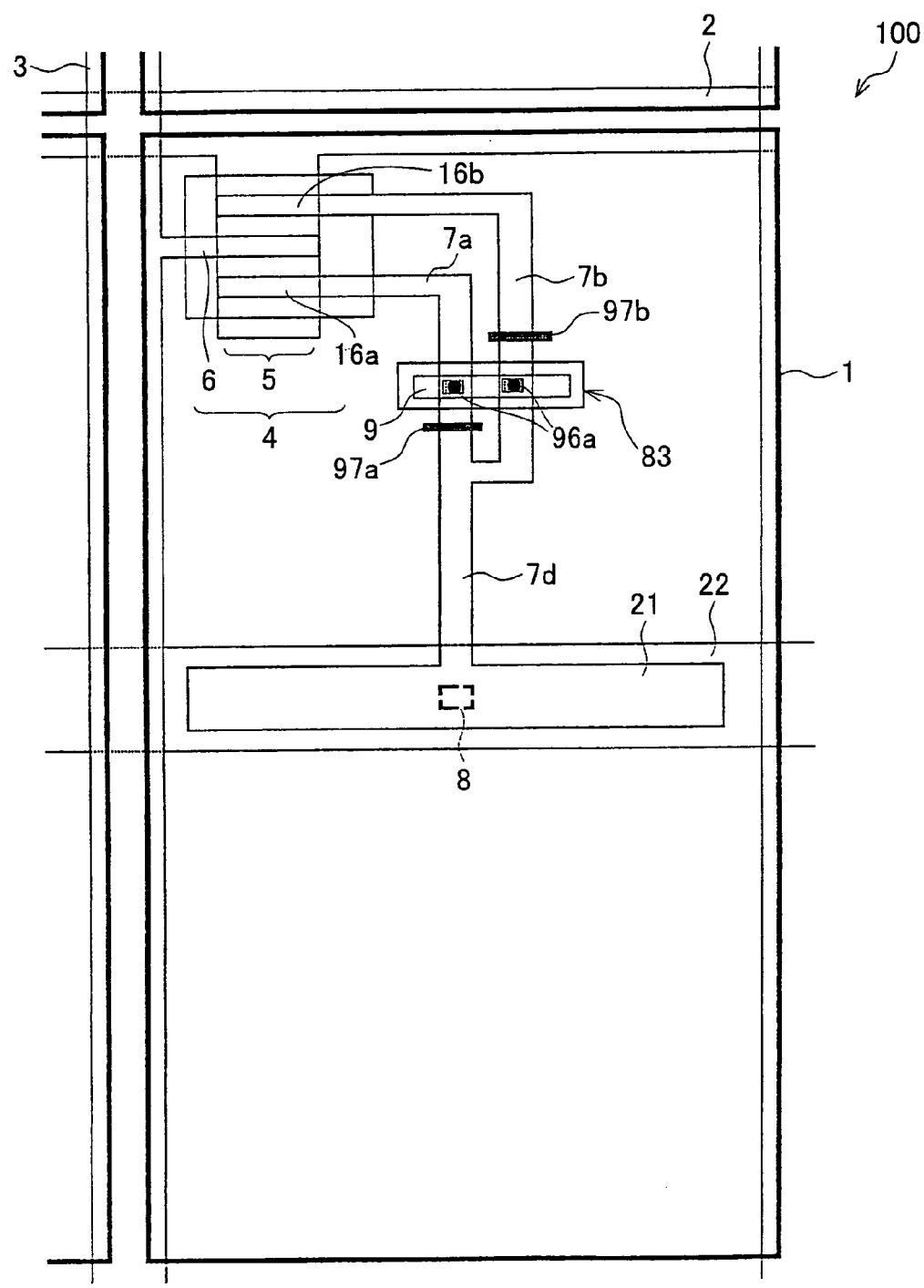
[FIG. 25]
A schematic plan view showing a structure of a pixel in an active matrix substrate according to Sixth Embodiment.
Figure 28:
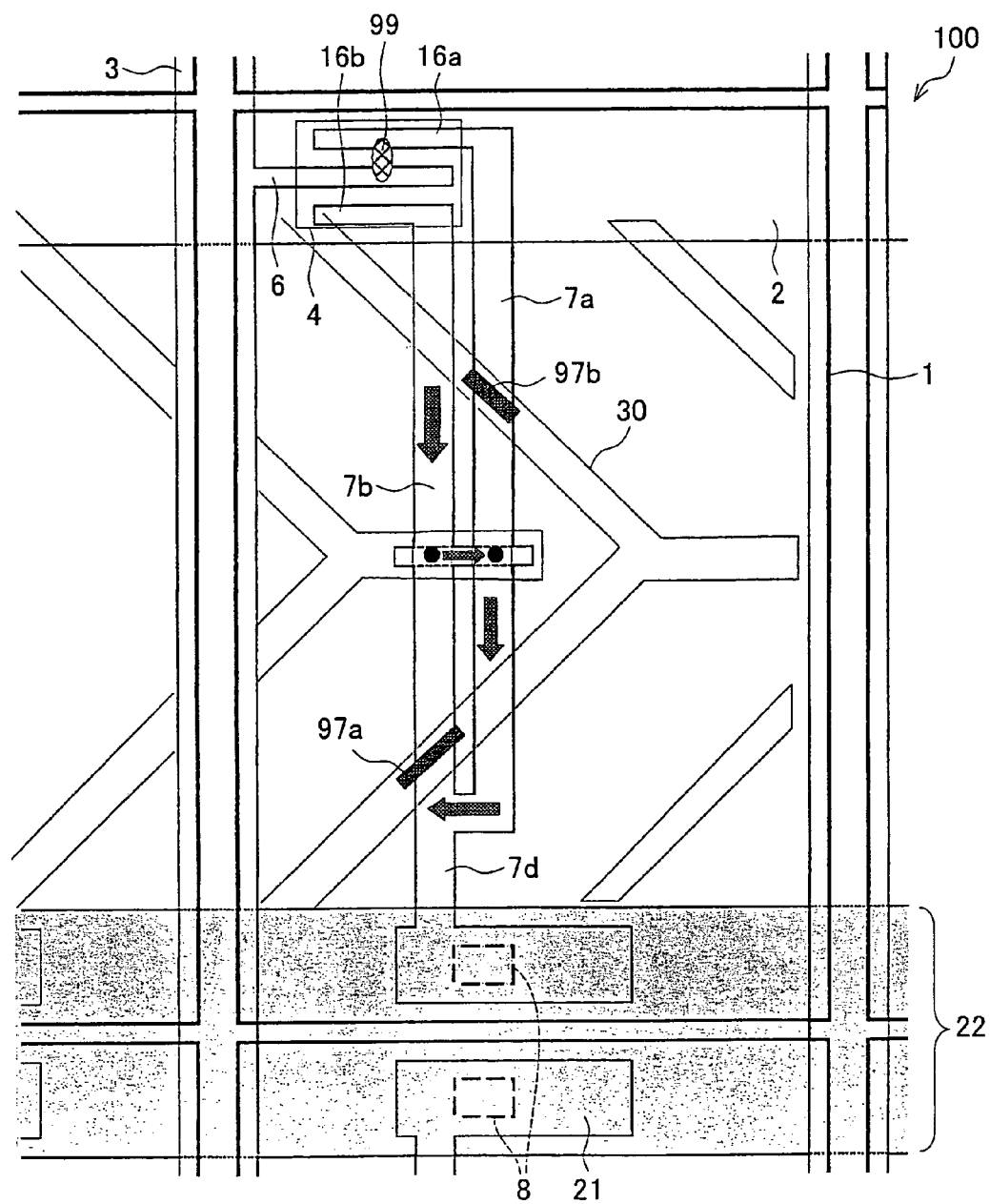
[FIG. 28]
A schematic plan view showing a structure of a pixel in still another active matrix substrate according to Sixth Embodiment.

In contrast, in the active matrix substrates 100 of FIGS. 25, 27 and 28, the pixel electrode 1 includes a removal section 83 which is a portion where ITO, which is the material of pixel electrode, is removed, and is partly overlapped with the drain outgoing wire branch sections 7a and 7b.

More specifically, in the structure of FIG. 25, the removal section 83 is provided corresponding to the correction connection electrode 9. With this layout, it is possible to prevent the leak between the pixel electrode 1 and the drain outgoing wire branch section 7a (or 7b) connected to the SD leak channel when the drain outgoing wire branch section 7a or 7b are connected to the correction connection electrode 9.

Figure 26:
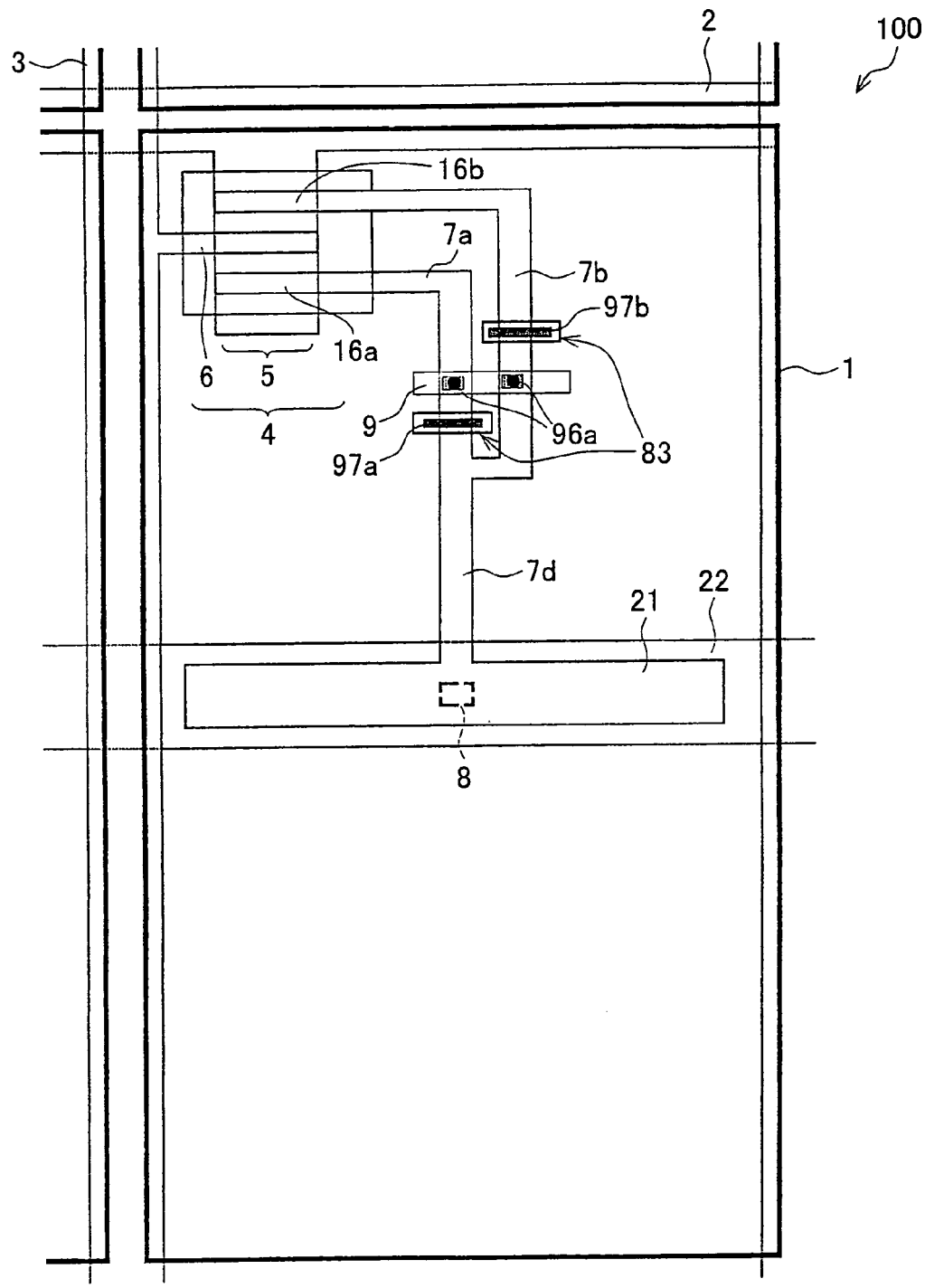
[FIG. 26]
A schematic plan view showing a structure of a pixel in another active matrix substrate according to Sixth Embodiment.

Further, in the active matrix substrate 100 of FIG. 26, the removal section 83 is provided corresponding to the cutting portion of the drain outgoing wire branch section 7a or 7b. With this arrangement, it is possible to prevent the leak between the pixel electrode 1 and the drain outgoing wire branch section 7a (or 7b) connected to the SD leak channel when the drain outgoing wire branch section 7a or 7b is cut.

Further, in the structure of FIG. 27, the removal section 83 is positioned corresponding to the correction connection electrode 9 and the drain outgoing wire branch sections 7a and 7b. With this arrangement, it is possible to prevent the leak between the pixel electrode 1 and the drain outgoing wire branch section 7a (or 7b) connected to the SD leak channel when the drain outgoing wire branch section 7a or 7b are connected to the correction connection electrode 9, or when the drain outgoing wire branch section 7a or 7b is cut.

Further, the removal section 83 may be so constituted as to be a part of the liquid crystal molecule alignment control electrode slit 30 of the pixel electrode 1. As explained in Forth Embodiment, the region where the alignment control electrode slit 30 is formed does not normally function as a transmission region (opening section) in the liquid crystal display apparatus. By thus using the alignment control electrode slit 30 as the removal section 83, provision of removal section 83 does not decrease the aperture ratio.

FIG. 28 shows a structure of an active matrix substrate in which the alignment control electrode slit 30 functions as the removal section 83. In the structure of FIG. 28, the alignment control electrode slit 30 serves as the removal section 83, and the laser irradiation sections 97a and 97b are inclined along the slit.

Figure 29:
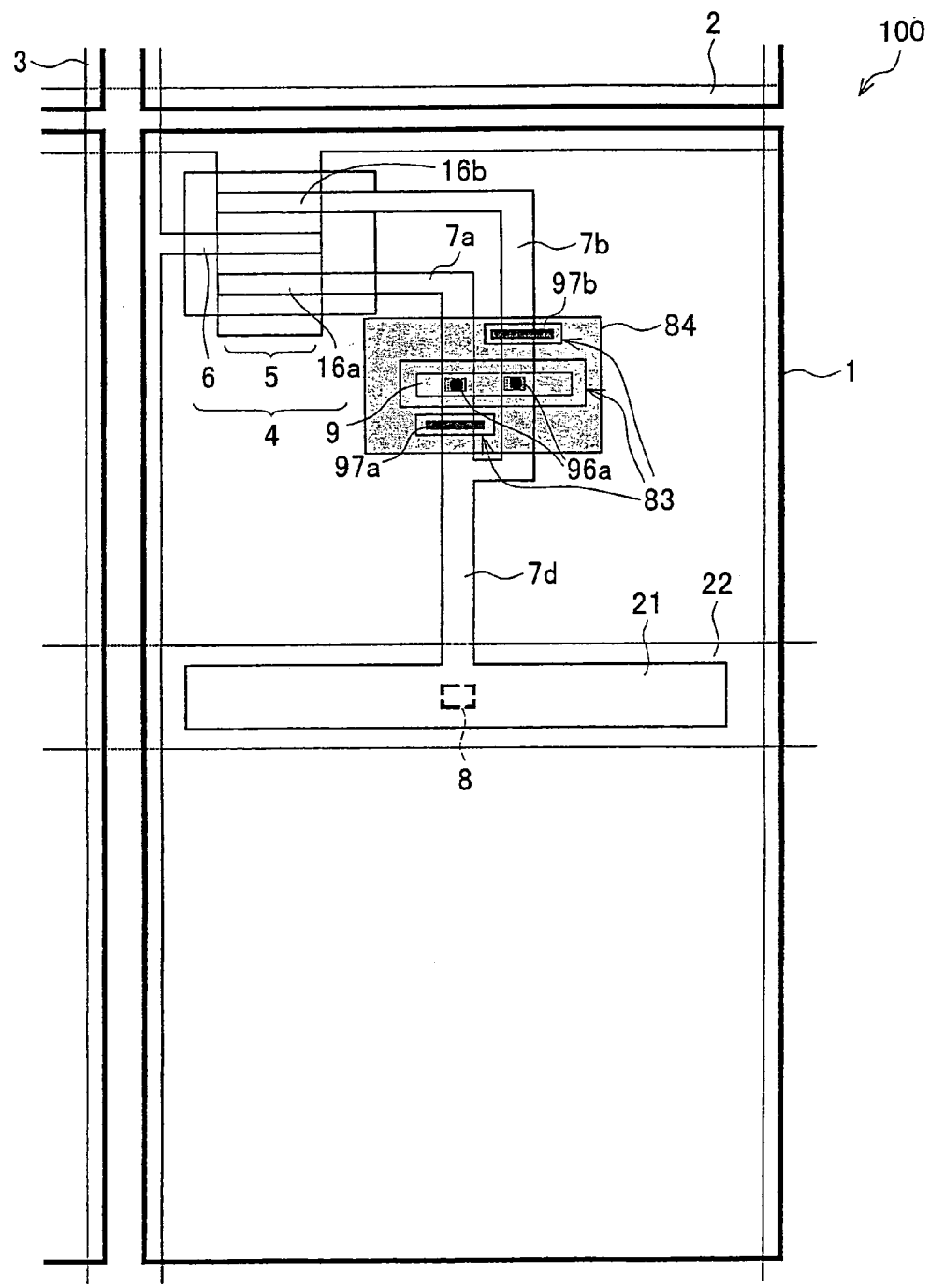
[FIG. 29]
A schematic plan view showing a structure of a pixel in still another active matrix substrate according to Sixth Embodiment. The view also shows the main part of a counter substrate overlapped thereon.

Since the removal section 83 disturbs the alignment of liquid crystal molecules, it is preferable to provide a light-shielding film 84 for blocking the removal section 83 from light, as shown in FIG. 29. In the structure of FIG. 29, the color filter substrate, which is provided as a counter substrate opposed to the active matrix substrate 100, is blocked from light by a black matrix. It is also allowable to provide the light-shielding film 84 on the active matrix substrate 100 as long as the light-shielding film 84 blocks the removal section 83 from light when viewed as a display apparatus from the vertical direction of the substrate (liquid crystal panel).

SEVENTH EMBODIMENT

Figure 30:
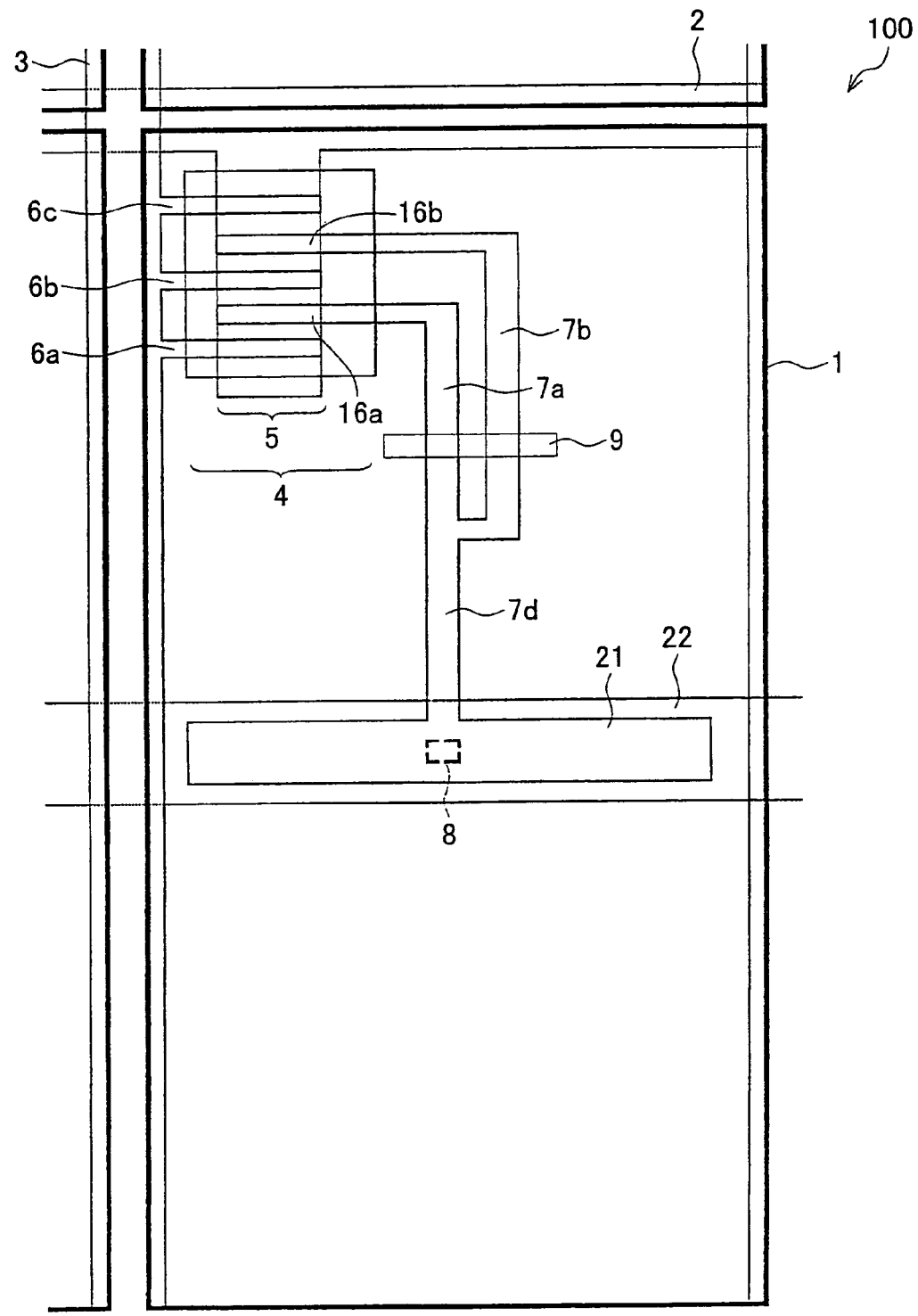
[FIG. 30]
A schematic plan view showing a structure of a pixel in an active matrix substrate according to Seventh Embodiment.

The following describes another embodiment (Seventh Embodiment) of the present invention with reference to FIG. 30. For ease of explanation, materials having the equivalent functions as those shown in the drawings pertaining to the foregoing First to Sixth Embodiments will be given the same reference symbols, and explanation thereof will be omitted here.

The active matrix substrate 100 according to the present embodiment is the same as the active matrix substrate 100 of FIG. 8 of Second Embodiment, except for the number of source electrodes 6. The active matrix substrate 100 of FIG. 8 includes two (plural) drain electrodes for a single source electrode 6. The active matrix substrate of FIG. 8 has two channels. On the other hand, as shown in FIG. 30, the active matrix substrate 100 of the present embodiment includes three source electrodes 6a, 6b and 6c. The source electrodes 6a and 6b correspond to the drain electrode 16a, and the source electrode 6b and 6c correspond to the drain electrode 16b. The active matrix substrate 100 of FIG. 30 has four channels.

An active matrix substrate including plural drain electrodes for a single source electrode, such as the active matrix substrate 100 of FIG. 8 including two drain electrodes 16a and 16b for a single source electrode 6, ensures effects of high-speed display response and reduction of power consumption.

On the other hand, the active matrix substrate 100 of FIG. 30 does not ensure these effects. However, the active matrix substrate 100 of FIG. 30 with the two drain outgoing wire branch sections 7a and 7b has the same number (three) of channels as those of the active matrix 100 of FIG. 11 having three drain outgoing wire branch section 7a, 7b and 7c.

With this arrangement, the active matrix substrate of the present embodiment ensures the number of channels and also prevents decrease of pixel potential by the parasitic capacitor (Cgd) between the source electrode and the drain electrode of the TFT 4. On this account, it is possible to decrease the source voltage which increases the pixel electrode 1 to a desired effective voltage. As a result, the entire power consumption is reduced.

Note that, the described Embodiments 1 through 7 may be freely combined. For example, the embodiment in which a plurality of correction connection electrodes is provided for a single TFT may have a removal section. Similarly, the embodiment in which a plurality of correction connection electrodes is provided for a single TFT may be combined with another embodiment in which a plurality of source electrodes are provided for a single drain electrode, which ensures the number of channels and also reduces power consumption.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

With the present invention it becomes possible to prevent to some extent breakage of electrode connected to a signal line and decrease of aperture ratio, in an active matrix substrate or a display apparatus in which pixel defect is corrected within the pixel concerned.

Apart from the usage as a panel substrate of a display apparatus, the active matrix substrate according to the present invention gives an effect of increase of yield of display apparatus. The active matrix substrate of the present invention is particularly useful for a componential member of a large-sized TV which requires effective prevention of point defect.

The present invention is not limitedly used for a liquid crystal display apparatus, and may be adopted for other types of display apparatuses. For example, it may be used for an organic EL display with the following manner. The active matrix substrate according to the present invention is placed opposite to a color filter substrate, and an organic EL layer is provided between the two substrates to form an organic EL panel, which is completed as an organic EL display apparatus by connecting into a driver or the like via an external connection terminal. More specifically, the present invention is applicable to any kinds of display apparatus other than a liquid crystal display apparatus or an organic EL display apparatus, as long as the display apparatus uses an active matrix substrate.

The invention claimed is:

1. An active matrix substrate including an active element having at least one source electrode, two or more drain electrodes, and two or more channels, at least one of said drain electrodes is electrically connected to a pixel electrode via a wire section, said wire section includes a first conductive pattern section having a common section continuous to a pixel electrode and branch sections each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer.

2. The active matrix substrate as set forth in claim 1, wherein each one of said source electrodes corresponds to two or more of said drain electrodes.

3. The active matrix substrate as set forth in claim 1, wherein each one of said drain electrode corresponds to two or more of said source electrode.

4. The active matrix substrate as set forth in claim 1, wherein said second conductive pattern section is formed by electrically separating a gate electrode conductive layer of said active element from at least one conductive layer.

5. The active matrix substrate as set forth in claim 1, wherein said second conductive pattern section is so formed that a retention capacitor wire conductive layer is electrically separable from at least one conductive layer.

6. The active matrix substrate as set forth in claim 1 comprising a plurality of said second conductive patterns for each of said active element.

7. The active matrix substrate as set forth in claim 6, wherein three or more of said drain electrodes are provided for each of said active element, and three or more of said branch sections are provided for each of the drain electrodes, said plural second conductive patterns including a second conductive pattern A section which is electrically connectable to all of the branch sections; and a second conductive pattern B section which is electrically connectable to two or more of the branch sections.

8. The active matrix substrate as set forth in claim 7, wherein said second conductive pattern B section is formed with a portion overlapped with a branch section longest in length among the plural branch sections in the first conductive section, so as to enable said branch section longest in length to be electrically connectable to another branch section.

9. The active matrix substrate as set forth in claim 1, wherein the active matrix substrate includes pixels each of which is constituted of plural sub-pixels, each of said sub-pixels including an active element having said second conductive pattern section.

10. The active matrix substrate as set forth in claim 9, wherein at least two of said sub-pixels differ from each other in luminance.

11. The active matrix substrate as set forth in claim 1, wherein the overlapping portion of said second conductive pattern section overlapped with said branch sections of said first conductive pattern section via an insulating layer is 25 μm2 or greater in square measure dimension.

12. The active matrix substrate as set forth in claim 1, wherein said second conductive pattern section is constituted of at least one substance selected from a group consisting of Al, Cr, Ta, Ti, W, Mo and Cu.

13. The active matrix substrate as set forth in claim 1, wherein said second conductive pattern section has a portion overlapped with a liquid crystal molecule alignment control projection or a liquid crystal molecule alignment control electrode slit.

14. The active matrix substrate as set forth in claim 1, wherein said pixel electrode includes a removal section where a pixel electrode material has been removed, said removal section including a portion overlapped with said branch sections.

15. The active matrix substrate as set forth in claim 14, wherein said removal section is positioned corresponding to said second conductive pattern section.

16. The active matrix substrate as set forth in claim 14, wherein said removal section is positioned corresponding to a portion at which said branch section is cut.

17. The active matrix substrate as set forth in claim 14, wherein said removal section is positioned corresponding to said second conductive pattern section and a portion at which said branch section is cut.

18. The active matrix substrate as set forth in claim 14, wherein said removal section constitutes a part of an alignment control electrode slit, which is formed on said pixel electrode, for adjusting alignment of liquid crystal molecules.

19. The active matrix substrate as set forth in claim 14, further comprising a light-shielding film for shielding said removal section from light.

20. A display apparatus comprising said active matrix substrate as set forth in claim 1.

21. A display apparatus comprising said active matrix substrate as set forth in claim 14; and a light-shielding film for shielding said removal section of said active matrix substrate from light.

22. television image receiver comprising said display apparatus as set forth in claim 20; and a tuner section for receiving television broadcast.

23. A pixel defect correction method for an active matrix substrate, said active matrix substrate including an active element having at least one source electrode, two or more drain electrodes, and two or more channels, at least one of said drain electrodes is electrically connected to a pixel electrode via a wire section, said wire section includes a first conductive pattern section having a common section continuous to a pixel electrode and branch sections each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer, said pixel defect correction method comprising the step of (i) cutting at least one of said branch sections of a defective pixel at a portion between said overlapping portion and said common section.

24. The pixel defect correction method for an active matrix substrate as set forth in claim 23, further comprising the steps of, in the case where the pixel defect cannot be solved by the step of cutting said branch section, electrically connecting a half branch section connected to said drain electrode resulted from the cutting step (i) into the other branch section(s) by conducting said second conductive pattern section into said other branch sections through said insulating layer so as to electrically connect the half branch section and the common section; and cutting at least one of said branch sections having not been cut.

25. pixel defect correction method as set forth in claim 23 wherein the portion where said second conductive pattern section and said branch section(s) of said first conductive pattern section are overlapped is irradiated with laser so that at least either one of the second conductive pattern or the branch section is melted, so as to conduct respective second conductive pattern sections through said insulating layer.

26. A manufacturing method for a display apparatus using either of said pixel defect correction method as set forth in claim 23.

27. A pixel defect correction method for an active matrix substrate, said active matrix substrate including an active element having at least one source electrode, two or more drain electrodes, and two or more channels, at least one of said drain electrodes is electrically connected to a pixel electrode via a wire section, said wire section including a first conductive pattern section having a common section continuous to a pixel electrode and branch sections each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer, said pixel defect correction method comprising the steps of (i) cutting at least one of said branch sections of a defective pixel at a portion between said overlapping portion and said common section; (ii) checking whether or not the pixel defect has been solved by the cutting of said branch section; and (iii) in the case where the pixel defect cannot be solved by the step of cutting said branch section, electrically connecting a half branch section connected to said drain electrode resulted from the cutting step (i) into the other branch section(s) by conducting said second conductive pattern section into said other branch sections through said insulating layer so as to electrically connect the half branch section and the common section, and cutting at least one of said branch sections having not been cut, wherein: the steps (ii) and (iii) are repeated until the pixel defect is solved.

28. A method for manufacturing an active matrix substrate, said active matrix substrate including an active element having at least one source electrode, two or more drain electrodes, and two or more channels, at least one of said drain electrodes is electrically connected to a pixel electrode via a wire section, said wire section including a first conductive pattern section having a common section continuous to a pixel electrode and branch sections each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer, said method performing pixel defect correction by carrying out the step of: (i) cutting at least one of said branch sections of a defective pixel at a portion between said overlapping portion and said common section.

29. The manufacturing method of an active matrix substrate as set forth in claim 28, further comprising the step of: (vi) forming the second conductive pattern section by electrically separating a retention capacitor wire conductive layer from at least one conductive layer.

30. A method for manufacturing an active matrix substrate, said active matrix substrate including an active element having at least one source electrode, two or more drain electrodes, and two or more channels, at least one of said drain electrodes is electrically connected to a pixel electrode via a wire section, said wire section includes a first conductive pattern section having a common section continuous to a pixel electrode and branch sections each of which extends from said common section and is broken into each of said drain electrodes, said active matrix substrate further including a second conductive pattern section which has an overlapping portion overlapped with said branch sections of said first conductive pattern section via an insulating layer, said second conductive pattern section being electrically connectable to a plurality of said branch sections by being conducted to said overlapping portion through said insulating layer, said method performing pixel defect correction by carrying out the step of: (i) cutting at least one of said branch sections of a defective pixel at a portion between said overlapping portion and said common section; (ii) checking whether or not the pixel defect has been solved by the cutting of said branch section; and (iii) in the case where the pixel defect cannot be solved by the step of cutting said branch section, electrically connecting a half branch section connected to said drain electrode resulted from the cutting step (i) into the other branch section(s) by conducting said second conductive pattern section into said other branch sections through said insulating layer so as to electrically connect the half branch section and the common section, and cutting at least one of said branch sections having not been cut, wherein: the steps (ii) and (iii) are repeated until the pixel defect is solved.

* * * * *